United States Patent
Zi et al.

(10) Patent No.: US 11,054,742 B2
(45) Date of Patent: Jul. 6, 2021

(54) EUV METALLIC RESIST PERFORMANCE ENHANCEMENT VIA ADDITIVES

(71) Applicant: Taiwan Semiconductor Manufacturing Co., Ltd., Hsinchu (TW)

(72) Inventors: An-Ren Zi, Hsinchu (TW); Joy Cheng, Taoyuan (TW); Ching-Yu Chang, Yilang County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 203 days.

(21) Appl. No.: 16/009,795

(22) Filed: Jun. 15, 2018

(65) Prior Publication Data

US 2019/0384173 A1 Dec. 19, 2019

(51) Int. Cl.
G03F 7/004 (2006.01)

(52) U.S. Cl.
CPC .......... *G03F 7/0048* (2013.01); *G03F 7/0042* (2013.01); *G03F 7/0045* (2013.01); *G03F 7/0047* (2013.01)

(58) Field of Classification Search
CPC .. G03F 7/0042–0044; G03F 7/06; G03F 7/04; G03F 7/0047
See application file for complete search history.

(56) References Cited

U.S. PATENT DOCUMENTS

| | | | |
|---|---|---|---|
| 6,395,451 B1* | 5/2002 | Jung | G03F 7/0045 430/270.1 |
| 6,788,477 B2 | 9/2004 | Lin | |
| 8,039,179 B2 | 10/2011 | Shieh et al. | |
| 8,199,314 B2 | 6/2012 | Peng et al. | |
| 8,202,680 B2 | 6/2012 | Chang | |
| 8,202,681 B2 | 6/2012 | Lin et al. | |
| 8,208,116 B2 | 6/2012 | Lin et al. | |
| 8,216,767 B2 | 7/2012 | Wang et al. | |
| 8,253,922 B2 | 8/2012 | Lin et al. | |
| 8,264,662 B2 | 9/2012 | Chen et al. | |
| 8,323,870 B2 | 12/2012 | Lee et al. | |

(Continued)

FOREIGN PATENT DOCUMENTS

| | | |
|---|---|---|
| JP | 2015157807 | 9/2015 |
| KR | 20010028348 | 4/2001 |

(Continued)

OTHER PUBLICATIONS

Spectrum Safety data sheet (revised Sep. 18, 2017) for product name: Propylene Glycol Methyl Ether Acetate, 12 pages obtained from world wide web Feb. 2020. (Year: 2017).*

(Continued)

*Primary Examiner* — Cynthia Hamilton
(74) *Attorney, Agent, or Firm* — Haynes and Boone, LLP

(57) ABSTRACT

A photoresist layer is formed over a wafer. The photoresist layer includes a metallic photoresist material and one or more additives. An extreme ultraviolet (EUV) lithography process is performed using the photoresist layer. The one or more additives include: a solvent having a boiling point greater than about 150 degrees Celsius, a photo acid generator, a photo base generator, a quencher, a photo de-composed base, a thermal acid generator, or a photo sensitivity cross-linker.

20 Claims, 15 Drawing Sheets

(56) References Cited

U.S. PATENT DOCUMENTS

| | | | |
|---|---|---|---|
| 8,383,322 B2 | 2/2013 | Chang et al. |
| 8,415,091 B2 | 4/2013 | Chang |
| 8,464,186 B2 | 6/2013 | Wang et al. |
| 8,468,473 B1 | 6/2013 | Wang et al. |
| 8,473,877 B2 | 6/2013 | Wang et al. |
| 8,507,159 B2 | 8/2013 | Wang et al. |
| 8,510,687 B1 | 8/2013 | Liu et al. |
| 8,524,427 B2 | 9/2013 | Shin et al. |
| 8,527,916 B1 | 9/2013 | Chiang et al. |
| 8,530,121 B2 | 9/2013 | Wang et al. |
| 8,563,224 B1 | 10/2013 | Chen et al. |
| 8,564,759 B2 | 10/2013 | Chang et al. |
| 8,572,520 B2 | 10/2013 | Chou et al. |
| 8,580,117 B2 | 11/2013 | Kao et al. |
| 8,584,057 B2 | 11/2013 | Liu et al. |
| 8,589,828 B2 | 11/2013 | Lee et al. |
| 8,589,830 B2 | 11/2013 | Chang et al. |
| 8,601,407 B2 | 12/2013 | Wang et al. |
| 8,609,308 B1 | 12/2013 | Chen et al. |
| 8,627,241 B2 | 1/2014 | Wang et al. |
| 8,628,897 B1 | 1/2014 | Lu et al. |
| 8,631,360 B2 | 1/2014 | Wang et al. |
| 8,631,361 B2 | 1/2014 | Feng |
| 8,658,344 B2 | 2/2014 | Wang et al. |
| 8,677,511 B2 | 3/2014 | Wang et al. |
| 8,679,707 B2 | 3/2014 | Lee et al. |
| 8,691,476 B2 | 4/2014 | Yu et al. |
| 8,709,682 B2 | 4/2014 | Chen et al. |
| 8,715,890 B2 | 5/2014 | Tu et al. |
| 8,715,919 B2 | 5/2014 | Chang et al. |
| 8,716,841 B1 | 5/2014 | Chang et al. |
| 8,722,286 B2 | 5/2014 | Yu et al. |
| 8,728,332 B2 | 5/2014 | Lin et al. |
| 8,732,626 B2 | 5/2014 | Liu et al. |
| 8,736,084 B2 | 5/2014 | Cheng et al. |
| 8,739,080 B1 | 5/2014 | Tsai et al. |
| 8,741,551 B2 | 6/2014 | Wu et al. |
| 8,745,550 B2 | 6/2014 | Cheng et al. |
| 8,751,976 B2 | 6/2014 | Tsai et al. |
| 8,753,788 B1 | 6/2014 | Yu et al. |
| 8,762,900 B2 | 6/2014 | Shin et al. |
| 8,764,995 B2 | 7/2014 | Chang et al. |
| 8,765,330 B2 | 7/2014 | Shih et al. |
| 8,765,582 B2 | 7/2014 | Hsu et al. |
| 8,767,178 B2 | 7/2014 | Lin et al. |
| 8,785,084 B2 | 7/2014 | Lu et al. |
| 8,802,354 B2 | 8/2014 | Chang |
| 8,812,999 B2 | 8/2014 | Liu et al. |
| 8,822,106 B2 | 9/2014 | Wang et al. |
| 8,822,243 B2 | 9/2014 | Yan et al. |
| 8,828,625 B2 | 9/2014 | Lu et al. |
| 8,828,632 B2 | 9/2014 | Wang et al. |
| 8,835,082 B2 | 9/2014 | Chen et al. |
| 8,837,810 B2 | 9/2014 | Chen et al. |
| 8,841,047 B2 | 9/2014 | Yu et al. |
| 8,841,049 B2 | 9/2014 | Wang et al. |
| 8,841,058 B2 | 9/2014 | Chang |
| 8,846,278 B2 | 9/2014 | Shin et al. |
| 8,850,366 B2 | 9/2014 | Liu et al. |
| 8,877,409 B2 | 11/2014 | Hsu et al. |
| 2004/0198861 A1* | 10/2004 | Ohno .................. G03F 7/0048 522/79 |
| 2006/0091468 A1 | 5/2006 | Liaw |
| 2011/0281208 A1 | 11/2011 | Lin et al. |
| 2012/0034558 A1 | 2/2012 | Chang |
| 2012/0045192 A1 | 2/2012 | Peng et al. |
| 2012/0180823 A1 | 7/2012 | Peng et al. |
| 2012/0236276 A1 | 9/2012 | Lin et al. |
| 2012/0278776 A1 | 11/2012 | Lei et al. |
| 2012/0308112 A1 | 12/2012 | Hu et al. |
| 2012/0320351 A1 | 12/2012 | Lin et al. |
| 2013/0029270 A1 | 1/2013 | Hatakeyama |
| 2013/0078572 A1 | 3/2013 | Shimizu et al. |
| 2013/0201461 A1 | 8/2013 | Huang et al. |
| 2013/0202992 A1 | 8/2013 | Chen et al. |
| 2013/0216949 A1 | 8/2013 | Chang |
| 2013/0258304 A1 | 10/2013 | Chang et al. |
| 2013/0267047 A1 | 10/2013 | Shih et al. |
| 2013/0295769 A1 | 11/2013 | Lin et al. |
| 2013/0309611 A1 | 11/2013 | Chang et al. |
| 2013/0320451 A1 | 12/2013 | Liu et al. |
| 2013/0323641 A1 | 12/2013 | Chang |
| 2014/0011133 A1 | 1/2014 | Liu et al. |
| 2014/0017615 A1 | 1/2014 | Chang |
| 2014/0017616 A1 | 1/2014 | Chang |
| 2014/0065843 A1 | 3/2014 | Chang et al. |
| 2014/0101624 A1 | 4/2014 | Wu et al. |
| 2014/0109026 A1 | 4/2014 | Wang et al. |
| 2014/0111779 A1 | 4/2014 | Chen et al. |
| 2014/0117563 A1 | 5/2014 | Yu et al. |
| 2014/0119638 A1 | 5/2014 | Chang et al. |
| 2014/0120459 A1 | 5/2014 | Liu et al. |
| 2014/0123084 A1 | 5/2014 | Tang et al. |
| 2014/0134759 A1 | 5/2014 | Lin et al. |
| 2014/0186773 A1 | 7/2014 | Chang |
| 2014/0193974 A1 | 7/2014 | Lee et al. |
| 2014/0215421 A1 | 7/2014 | Chen et al. |
| 2014/0226893 A1 | 8/2014 | Lo et al. |
| 2014/0242794 A1 | 8/2014 | Lin et al. |
| 2014/0253901 A1 | 9/2014 | Zhou et al. |
| 2014/0255850 A1 | 9/2014 | Chang et al. |
| 2014/0256067 A1 | 9/2014 | Cheng et al. |
| 2014/0257761 A1 | 9/2014 | Zhou et al. |
| 2014/0264760 A1 | 9/2014 | Chang et al. |
| 2014/0264899 A1 | 9/2014 | Chang et al. |
| 2014/0272709 A1 | 9/2014 | Liu et al. |
| 2014/0272726 A1 | 9/2014 | Chang |
| 2014/0273442 A1 | 9/2014 | Liu et al. |
| 2014/0273446 A1 | 9/2014 | Huang et al. |
| 2014/0273521 A1 | 9/2014 | Wu et al. |
| 2014/0282334 A1 | 9/2014 | Hu et al. |
| 2015/0079393 A1* | 3/2015 | Freedman ............. G03F 7/0042 428/402 |
| 2015/0234272 A1* | 8/2015 | Sarma .................. G03F 7/0045 430/281.1 |
| 2015/0286146 A1 | 10/2015 | Chang et al. |
| 2015/0309405 A1 | 10/2015 | Shih et al. |
| 2015/0311075 A1 | 10/2015 | Huang et al. |
| 2017/0029962 A1 | 2/2017 | Manikoth et al. |
| 2017/0102612 A1* | 4/2017 | Meyers ................ G03F 7/0042 |
| 2017/0168398 A1* | 6/2017 | Zi ............................ G03F 7/20 |
| 2018/0040474 A1 | 2/2018 | Zi et al. |
| 2018/0120697 A1* | 5/2018 | Fujimori ............... G03F 7/0044 |

FOREIGN PATENT DOCUMENTS

| | | |
|---|---|---|
| TW | 201029963 | 8/2010 |
| TW | 201721711 | 6/2017 |
| WO | 2010055406 | 5/2010 |
| WO | WO 2016/172737 A1 | 10/2016 |
| WO | WO-2017018084 A1 * | 2/2017 ........... G03F 7/0042 |

OTHER PUBLICATIONS

Sigma, Cyclohexanone, Product Information, one page obtained from world wide web, one page in Feb. 2020 (Year: 2020).*

MGM Chemicals, Ethyl Lactate, 9630 Technical Data Sheet, 4 pages dated Feb. 23, 2017 (Year: 2017).*

* cited by examiner

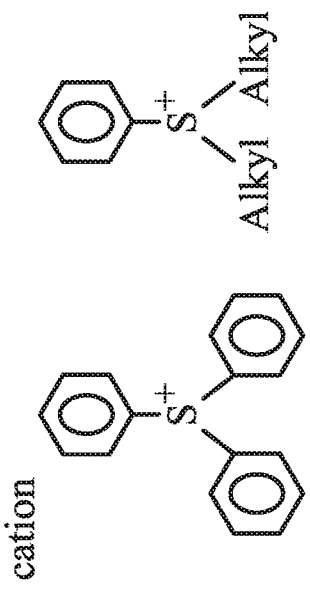
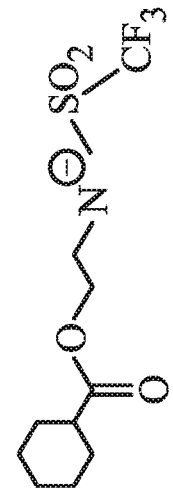
Fig. 9B
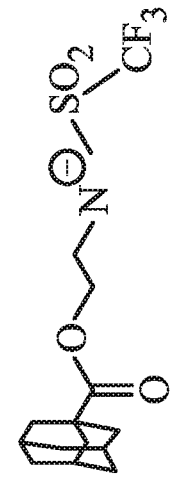
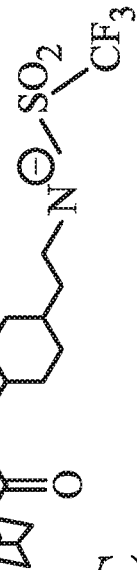
Fig. 9C
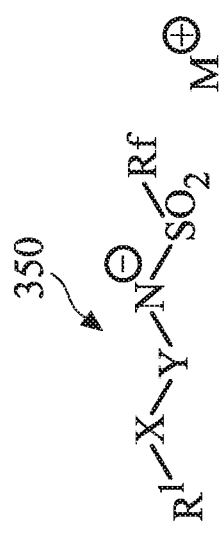
Fig. 9A
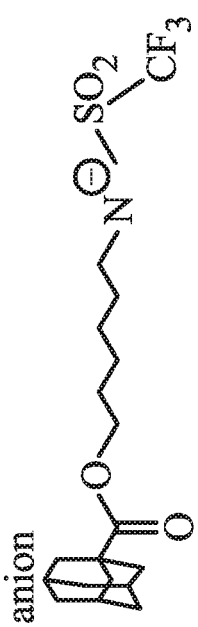
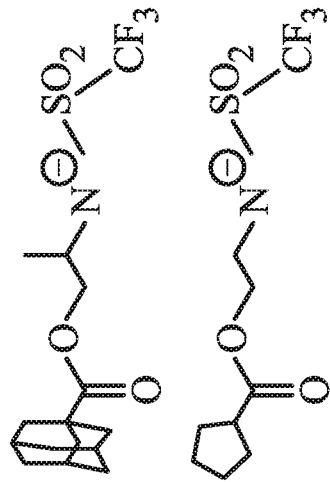

EUV METALLIC RESIST PERFORMANCE ENHANCEMENT VIA ADDITIVES

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

For these advances to be realized, similar developments in IC processing and manufacturing are needed. For example, the need to perform higher resolution lithography processes grows. One lithography technique is extreme ultraviolet (EUV) lithography. The EUV lithography employs scanners using light in the extreme ultraviolet region, having a wavelength of about 1-100 nanometers (nm). Some EUV scanners provide 4× reduction projection printing, similar to some optical scanners, except that the EUV scanners use reflective rather than refractive optics, i.e., mirrors instead of lenses. EUV scanners provide the desired pattern on an absorption layer ("EUV" mask absorber) formed on a reflective mask.

Despite the increasing popularity of EUV lithography, however, conventional EUV lithography may still have drawbacks. For example, a metallic type resist may be used for EUV lithography. However, conventional metallic type EUV resist may have problems related to aging and critical dimension (CD) control.

Therefore, while conventional EUV lithography has been generally adequate for its intended purposes, it has not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5, 6A-6B, 7, 8, 9A, 9B, 9C, 10, and 11A-11B illustrate the chemical formulas of different types of additives that can be added to a metallic photoresist according to embodiments of the present disclosure.

DETAILED DESCRIPTION

Figure 1:
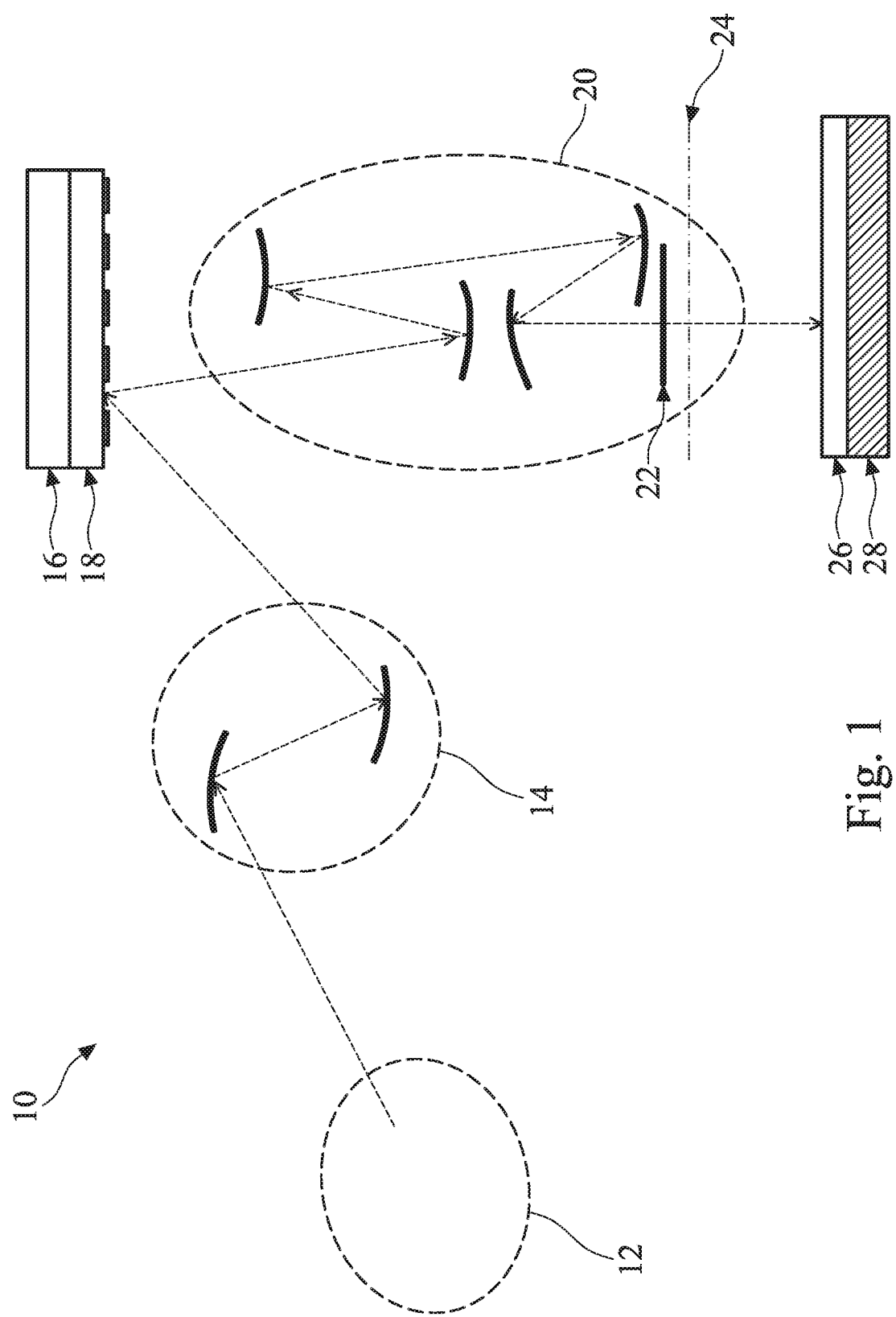
FIG. 1 is a schematic view of a lithography system constructed in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

Extreme ultraviolet (EUV) lithography has become widely used due to its ability to achieve small semiconductor device sizes. However, conventional systems and methods of performing EUV lithography may still have shortcomings. For example, EUV lithography may use metallic resists. Compared to conventional chemically amplified resists, metallic resists may offer advantages in terms of resolution or sensitivity. Yet in spite of these advantages, metallic resists used in EUV lithography may also have drawbacks such as aging related problems and/or poor critical dimension (CD) control. As such, metallic resists used in current EUV lithography are still not satisfactory in every aspect.

The inventors of the present disclosure have discovered that certain additives may be added to metallic resists in EUV lithography to improve the performance of the metallic resists. As examples, these additives may include, but are not limited to, high boiling point solvent, photo acid generator, photo base generator, normal quencher, photo de-composed base, thermal acid generator, or photo sensitivity cross-liner. These materials are not present in conventional metallic photoresists used for EUV lithography. Here, through the addition of these additives, the shelf life of the metallic photoresist may be prolonged by over a month, and the CD control of the metallic photoresist may be tightened to be less than 10% variation of the CD target.

These various aspects of the present disclosure are discussed in more detail below. First, a EUV lithography system will be discussed below with reference to FIGS. 1-2. Next, the details of the various additives are described according to embodiments of the present disclosure with reference to FIGS. 3-14.

FIG. 1 is a schematic view diagram of a EUV lithography system 10, constructed in accordance with some embodiments. The EUV lithography system 10 may also be generically referred to as a scanner that is configured to perform lithography exposure processes with respective radiation source and exposure mode. The EUV lithography system 10 is designed to expose a photoresist layer by EUV light or EUV radiation. The photoresist layer is a material sensitive to the EUV light. The EUV lithography system 10 employs a radiation source 12 to generate EUV light, such as EUV light having a wavelength ranging between about 1 nm and about 100 nm. In one particular example, the radiation source 12 generates a EUV light with a wavelength centered at about 13.5 nm. Accordingly, the radiation source 12 is also referred to as EUV radiation source 12.

The lithography system 10 also employs an illuminator 14. In various embodiments, the illuminator 14 includes various refractive optic components, such as a single lens or a lens system having multiple lenses (zone plates) or alternatively reflective optics (for EUV lithography system), such as a single mirror or a mirror system having multiple mirrors in order to direct light from the radiation source 12 onto a mask stage 16, particularly to a mask 18 secured on the mask stage 16. In the present embodiment where the radiation source 12 generates light in the EUV wavelength range, the illuminator 14 employs reflective optics. In some embodiments, the illuminator 14 includes a dipole illumination component.

In some embodiments, the illuminator 14 is operable to configure the mirrors to provide a proper illumination to the mask 18. In one example, the mirrors of the illuminator 14 are switchable to reflect EUV light to different illumination positions. In some embodiment, a stage prior to the illuminator 14 may additionally include other switchable mirrors that are controllable to direct the EUV light to different illumination positions with the mirrors of the illuminator 14. In some embodiments, the illuminator 14 is configured to provide an on-axis illumination (ONI) to the mask 18. In an example, a disk illuminator 14 with partial coherence σ being at most 0.3 is employed. In some other embodiments, the illuminator 14 is configured to provide an off-axis illumination (OAI) to the mask 18. In an example, the illuminator 14 is a dipole illuminator. The dipole illuminator 14 has a partial coherence σ of at most 0.3 in some embodiments.

The lithography system 10 also includes a mask stage 16 configured to secure a mask 18. In some embodiments, the mask stage 16 includes an electrostatic chuck (e-chuck) to secure the mask 18. This is because gas molecules absorb EUV light, and the lithography system for the EUV lithography patterning is maintained in a vacuum environment to avoid the EUV intensity loss. In the disclosure, the terms of mask, photomask, and reticle are used interchangeably to refer to the same item.

In the present embodiment, the lithography system 10 is a EUV lithography system, and the mask 18 is a reflective mask. One exemplary structure of the mask 18 is provided for illustration. The mask 18 includes a substrate with a suitable material, such as a low thermal expansion material (LTEM) or fused quartz. In various examples, the LTEM includes $TiO_2$ doped $SiO_2$, or other suitable materials with low thermal expansion. In some embodiments, the LTEM includes 5%-20% by weight $TiO_2$ and has a thermal coefficient of expansion lower than about $1.0 \times 10^{-6}/°$ C. For example, in some embodiments, the $TiO_2$ doped $SiO_2$ material of the LTEM has a coefficient thermal expansion such that it varies by less than 60 parts-per-billion for every 1 degree Celsius of temperature change. Of course, other suitable materials having thermal coefficient of expansion that is equal to or less than $TiO_2$ doped $SiO_2$ may also be used.

The mask 18 also includes a reflective ML deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light.

The mask 18 may further include a capping layer, such as ruthenium (Ru), disposed on the ML for protection. The mask 18 further includes an absorption layer deposited over the ML. The absorption layer is patterned to define a layer of an integrated circuit (IC). Alternatively, another reflective layer may be deposited over the ML and is patterned to define a layer of an integrated circuit, thereby forming a EUV phase shift mask.

The lithography system 10 also includes a projection optics module (or projection optics box (POB) 20 for imaging the pattern of the mask 18 on to a semiconductor substrate (as an example of the target 26) secured on a substrate stage 28 of the lithography system 10. The POB 20 has refractive optics (such as for UV lithography system) or alternatively reflective optics (such as for EUV lithography system) in various embodiments. The light directed from the mask 18, diffracted into various diffraction orders and carrying the image of the pattern defined on the mask, is collected by the POB 20. The POB 20 may include a magnification of less than one (thereby the size of the "image" on a target (such as target 26 discussed below) is smaller than the size of the corresponding "object" on the mask). The illuminator 14 and the POB 20 are collectively referred to as an optical module of the lithography system 10.

The lithography system 10 also includes a pupil phase modulator 22 to modulate optical phase of the light directed from the mask 18 so that the light has a phase distribution on a projection pupil plane 24. In the optical module, there is a plane with field distribution corresponding to Fourier Transform of the object (the mask 18 in the present case). This plane is referred to as projection pupil plane. The pupil phase modulator 22 provides a mechanism to modulate the optical phase of the light on the projection pupil plane 24. In some embodiments, the pupil phase modulator 22 includes a mechanism to tune the reflective mirrors of the POB 20 for phase modulation. For example, the mirrors of the POB 20 are switchable and are controlled to reflect the EUV light, thereby modulating the phase of the light through the POB 20.

In some embodiments, the pupil phase modulator 22 utilizes a pupil filter placed on the projection pupil plane. A pupil filter filters out specific spatial frequency components of the EUV light from the mask 18. Particularly, the pupil filter is a phase pupil filter that functions to modulate phase distribution of the light directed through the POB 20. However, utilizing a phase pupil filter is limited in some lithography system (such as an EUV lithography system) since all materials absorb EUV light.

As discussed above, the lithography system 10 also includes the substrate stage 28 to secure a target 26 to be patterned, such as a semiconductor substrate. In the present embodiment, the semiconductor substrate is a semiconductor wafer, such as a silicon wafer or other type of wafer. The target 26 (such as substrate) is coated with the resist layer sensitive to the radiation beam, such as EUV light in the present embodiment. Various components including those described above are integrated together and are operable to perform lithography exposing processes. The lithography system 10 may further include other modules or may be integrated with (or be coupled with) other modules.

The mask 18 and the method making the same are further described in accordance with some embodiments. In some embodiments, the mask fabrication process includes two operations: a blank mask fabrication process and a mask patterning process. During the blank mask fabrication process, a blank mask is formed by deposing suitable layers (e.g., reflective multiple layers) on a suitable substrate. The blank mask is then patterned during the mask patterning process to achieve a desired design of a layer of an integrated circuit (IC). The patterned mask is then used to transfer circuit patterns (e.g., the design of a layer of an IC) onto a semiconductor wafer. The patterns can be transferred over and over onto multiple wafers through various lithography processes. A set of masks is used to construct a complete IC.

The mask 18 includes a suitable structure, such as a binary intensity mask (BIM) and phase-shifting mask (PSM) in various embodiments. An example BIM includes absorptive regions (also referred to as opaque regions) and reflective regions, patterned to define an IC pattern to be transferred to the target. In the opaque regions, an absorber is present, and an incident light is almost fully absorbed by the absorber. In the reflective regions, the absorber is removed and the incident light is diffracted by a multilayer (ML). The PSM can be an attenuated PSM (AttPSM) or an alternating PSM (AltPSM). An exemplary PSM includes a first reflective layer (such as a reflective ML) and a second reflective layer patterned according to an IC pattern. In some examples, an AttPSM usually has a reflectivity of 2%-15% from its absorber, while an AltPSM usually has a reflectivity of larger than 50% from its absorber.

Figure 2:
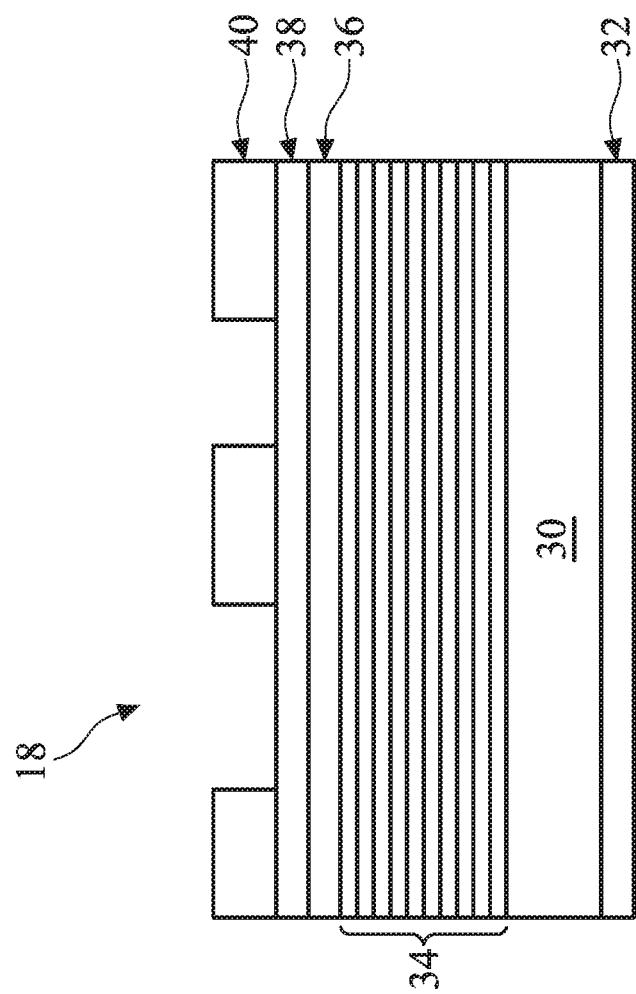
FIG. 2 is a sectional view of an EUV mask constructed in accordance with some embodiments of the present disclosure.

One example of the mask 18 is shown in FIG. 2. The mask 18 in the illustrated embodiment is a EUV mask, and includes a substrate 30 made of a LTEM. The LTEM material may include $TiO_2$ doped $SiO_2$, and/or other low thermal expansion materials known in the art. In some embodiments, a conductive layer 32 is additionally disposed under on the backside of the LTEM substrate 30 for the electrostatic chucking purpose. In one example, the conductive layer 32 includes chromium nitride (CrN). In other embodiments, other suitable compositions are possible, such as a tantalum-containing material.

The EUV mask 18 includes a reflective multilayer structure 34 disposed over the LTEM substrate 30. The reflective multilayer structure 34 may be selected such that it provides a high reflectivity to a selected radiation type/wavelength. The reflective multilayer structure 34 includes a plurality of film pairs, such as Mo/Si film pairs (e.g., a layer of molybdenum above or below a layer of silicon in each film pair). Alternatively, the reflective multilayer structure 34 may include Mo/Be film pairs, or any materials with refractive index difference being highly reflective at EUV wavelengths.

Still referring to FIG. 2, the EUV mask 18 also includes a capping layer 36 disposed over the reflective multilayer structure 34 to prevent oxidation of the ML. In one embodiment, the capping layer 36 includes silicon with a thickness ranging from about 4 nm to about 7 nm. The EUV mask 18 may further include a buffer layer 38 disposed above the capping layer 36 to serve as an etching-stop layer in a patterning or repairing process of an absorption layer, which will be described later. The buffer layer 38 has different etching characteristics from the absorption layer disposed thereabove. The buffer layer 38 includes ruthenium (Ru), Ru compounds such as RuB, RuSi, chromium (Cr), chromium oxide, and chromium nitride in various examples.

The EUV mask 18 also includes an absorber layer 40 (also referred to as an absorption layer) formed over the buffer layer 38. In some embodiments, the absorber layer 40 absorbs the EUV radiation directed onto the mask. In various embodiments, the absorber layer may be made of tantalum boron nitride (TaBN), tantalum boron oxide (TaBO), or chromium (Cr), Radium (Ra), or a suitable oxide or nitride (or alloy) of one or more of the following materials: Actium, Radium, Tellurium, Zinc, Copper, and Aluminum.

Figure 3:
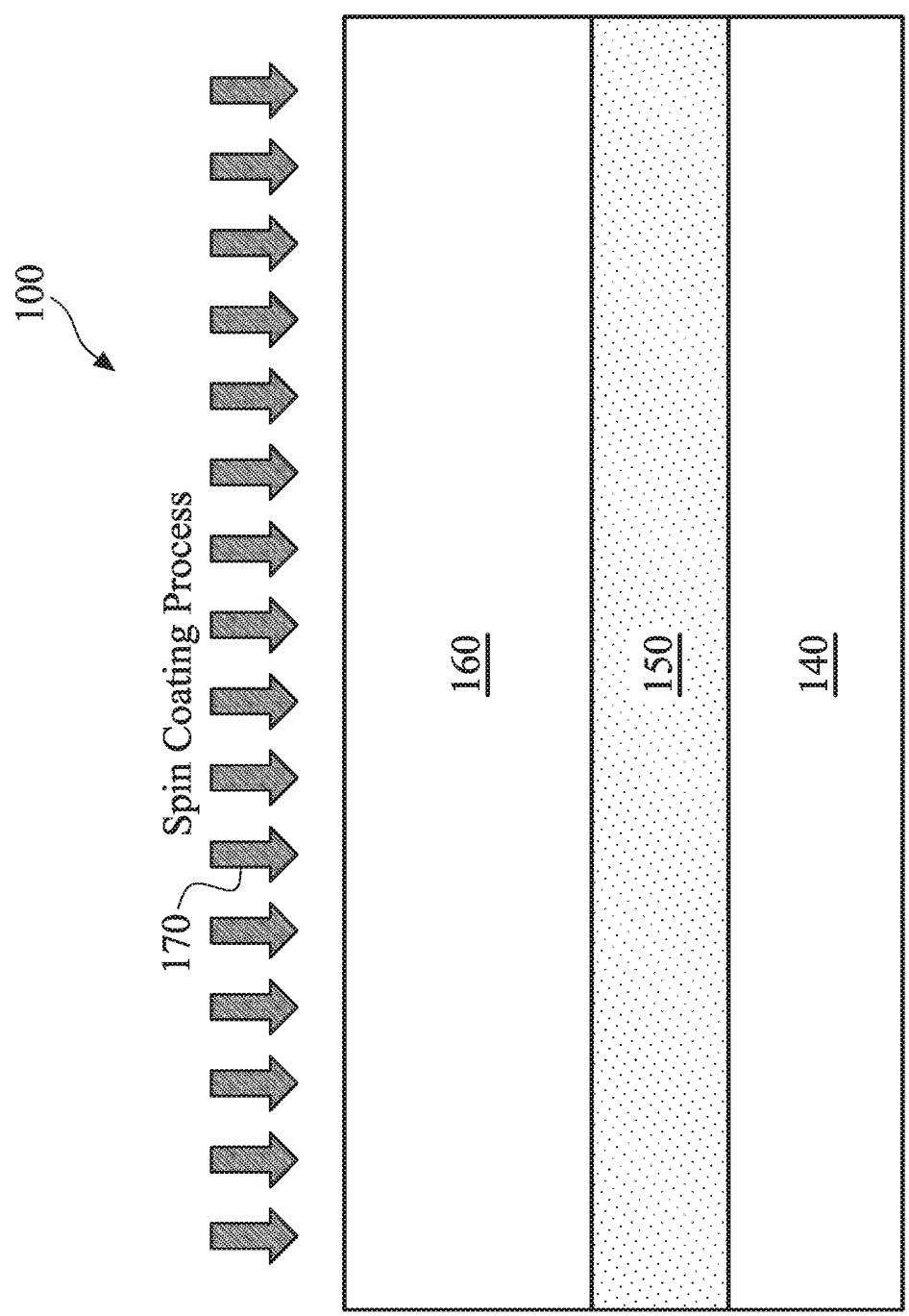
FIG. 3 is a diagrammatic fragmentary cross-sectional side view of a semiconductor device at a stage of fabrication in accordance with some embodiments of the present disclosure.
Figure 12:
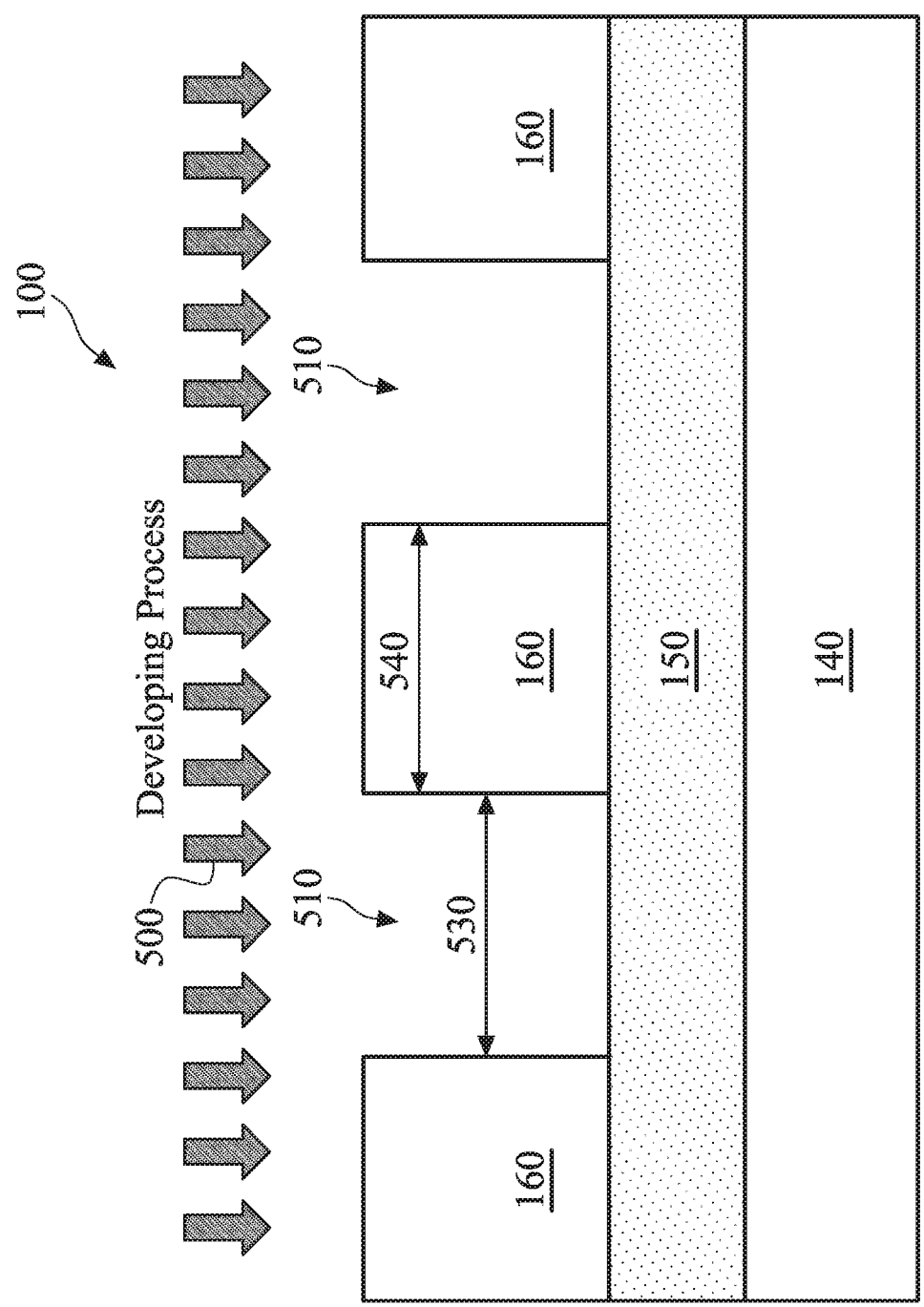
FIGS. 12-13 are diagrammatic fragmentary cross-sectional side views of a semiconductor device at various stages of fabrication in accordance with some embodiments of the present disclosure.
Figure 13:
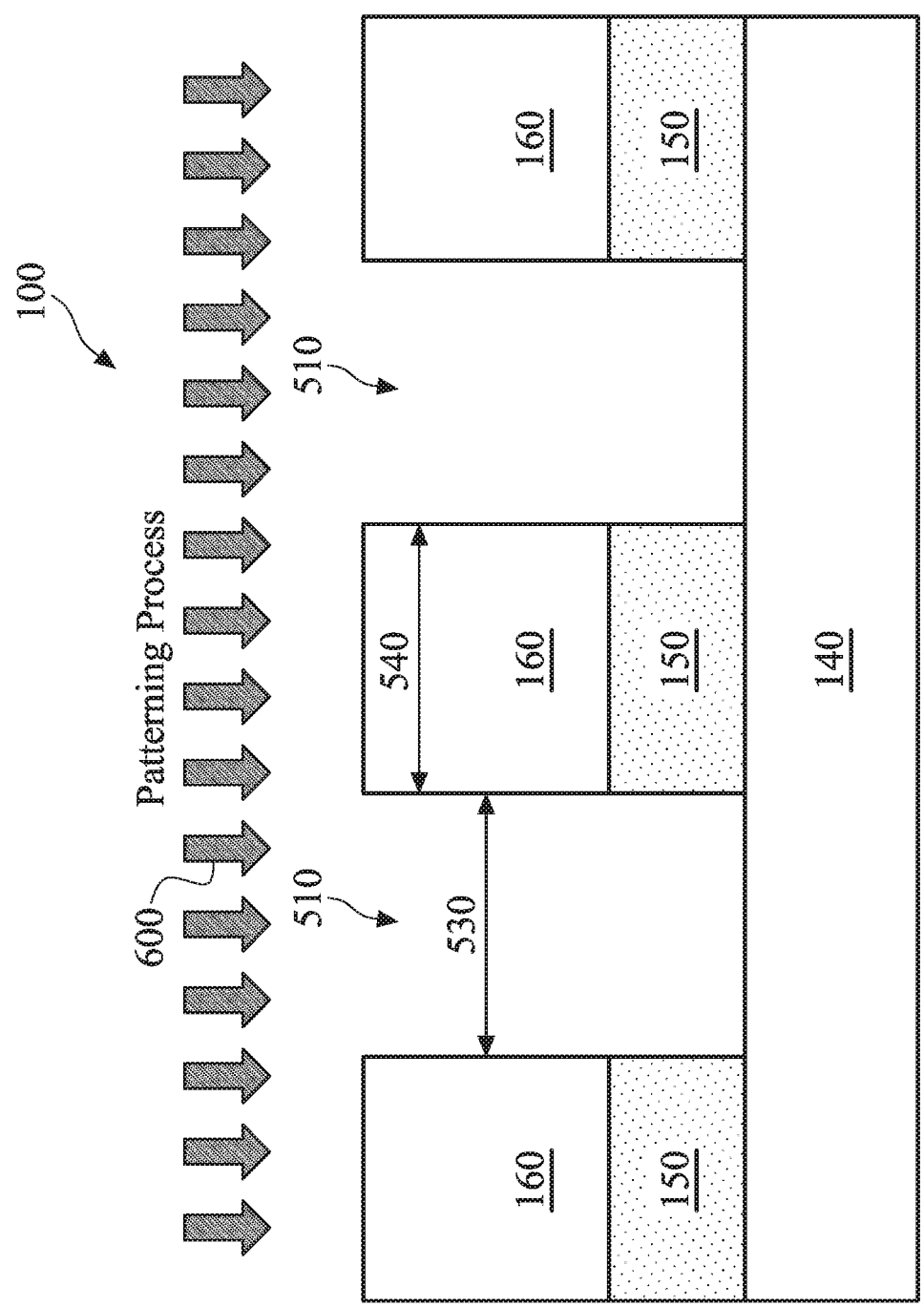

FIGS. 3 and 12-13 illustrate simplified diagrammatic fragmentary cross-sectional side views of a semiconductor device 100 at various stages of fabrication according to embodiments of the present disclosure. Referring to FIG. 3, a semiconductor device 100 includes a substrate 140. In some embodiments, the substrate 140 is a silicon substrate doped with a p-type dopant such as boron (for example a p-type substrate). Alternatively, the substrate 140 could be another suitable semiconductor material. For example, the substrate 140 may be a silicon substrate that is doped with an n-type dopant such as phosphorous or arsenic (an n-type substrate). The substrate 140 could include other elementary semiconductors such as germanium and diamond. The substrate 140 could optionally include a compound semiconductor and/or an alloy semiconductor. Further, the substrate 140 could include an epitaxial layer (epi layer), may be strained for performance enhancement, and may include a silicon-on-insulator (SOI) structure.

In some embodiments, the substrate 140 is substantially conductive or semi-conductive. The electrical resistance may be less than about $10^3$ ohm-meter. In some embodiments, the substrate 140 contains metal, metal alloy, or metal nitride/sulfide/selenide/oxide/silicide with the formula $MX_a$, where M is a metal, and X is N, S, Se, O, Si, and where "a" is in a range from about 0.4 to 2.5. For example, the substrate 140 may contain Ti, Al, Co, Ru, TiN, $WN_2$, or TaN.

In some other embodiments, the substrate 140 contains a dielectric material with a dielectric constant in a range from about 1 to about 140. In some other embodiments, the substrate 140 contains Si, metal oxide, or metal nitride, where the formula is $MX_b$, wherein M is a metal or Si, and X is N or O, and wherein "b" is in a range from about 0.4 to 2.5. For example, the substrate 140 may contain $SiO_2$, silicon nitride, aluminum oxide, hafnium oxide, or lanthanum oxide.

A material layer 150 is formed over the substrate 140. The material layer 150 can be patterned via a lithography process and as such may also be referred to as a patternable layer. In an embodiment, the material layer 150 includes a dielectric material, such as silicon oxide or silicon nitride. In another embodiment, the material layer 150 includes metal. In yet another embodiment, the material layer 150 includes a semiconductor material.

In some embodiments, the material layer 150 has different optical properties than photoresist. For example, the material layer 150 has a different n, k, or T value from photoresist. In some embodiments, the material layer 150 comprises at least one of different polymer structure, acid labile molecule, PAG (photo acid generator) loading, quencher loading, chromophore, cross linker, or solvent, which lead to different n value to photoresist. In some embodiments, the material layer 150 and photoresist have different etching resistance. In some embodiments, the material layer 150 contains an etching resistant molecule. The molecule includes low onishi number structure, double bond, triple bond, silicon, silicon nitride, Ti, TiN, Al, aluminum oxide, SiON, or combinations thereof. It is understood that the substrate 140 and the material layer 150 may each include additional suitable material compositions in other embodiments.

A photoresist layer 160 is formed over the substrate 140 (specifically, over the material layer 150). The photoresist layer 160 may be formed by a spin coating process 170, for example. The photoresist layer 160 contains a metallic photoresist material configured for EUV lithography. For example, the metallic photoresist material is sensitive to a radiation source such as the radiation source 12 discussed above in association with FIG. 1. The metal component in the metallic photoresist material can enhance EUV sensitivity.

The photoresist layer 160 may have a single-layer structure or a multi-layer structure. In one embodiment, the photoresist layer 160 includes a metallic resist material that chemically decomposes (and/or changes polarity) and subsequently becomes soluble in a developer after the metallic resist material is exposed to a radiation source (e.g., the radiation source 12). Alternatively, the photoresist layer 160 includes a metallic resist material that polymerizes (and/or crosslinks) and subsequently becomes insoluble in a developer after the metallic resist material is exposed to a radiation source (e.g., the radiation source 12).

Figure 4:
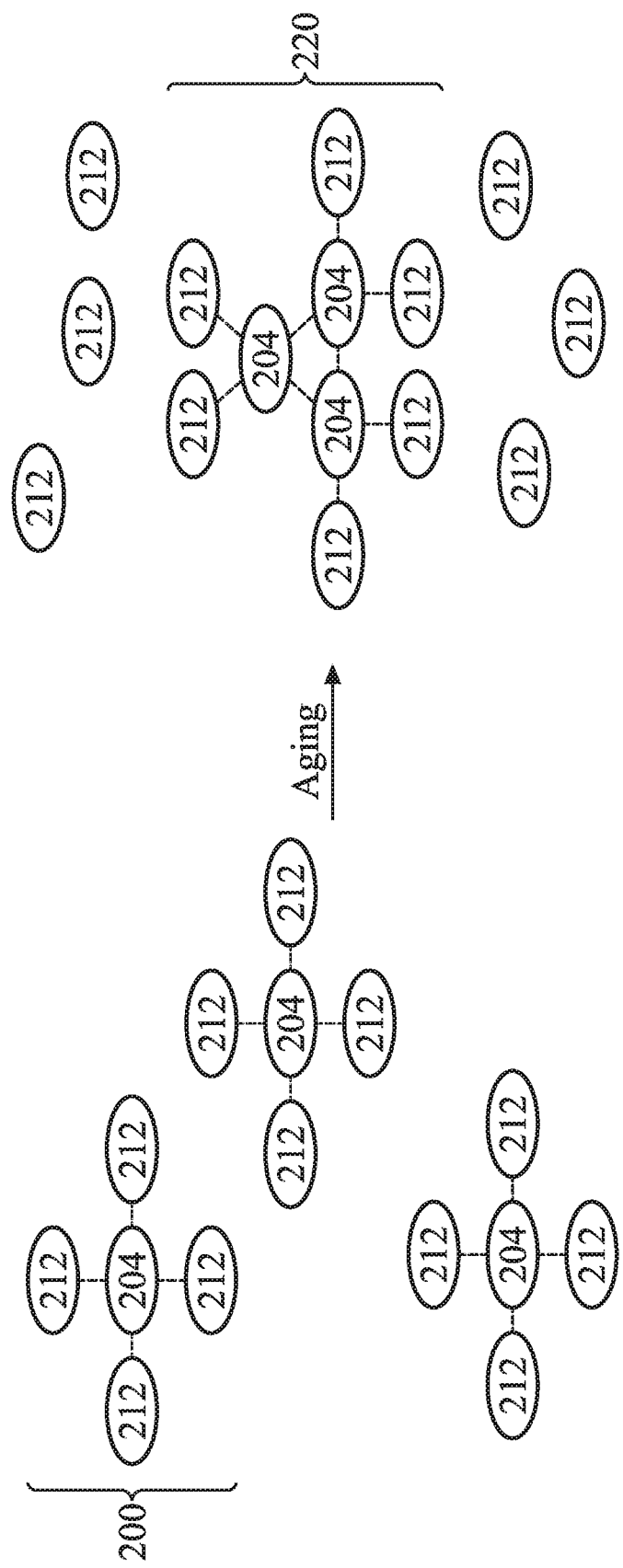
FIG. 4 is a diagram showing an aging problem of metallic photoresist.

Referring now to FIG. 4, in some embodiments, the metallic resist material of the photoresist layer 160 has a structure 200. The structure 200 may be a particle (e.g., a cluster) that includes a core group 204 surrounded by multiple ligands 212. In the embodiment illustrated in FIG. 4, the dotted lines indicate ionic, covalent, metallic, or van der Waals bonds between the core group 204 and the ligands 212. In many embodiments, the core group 204 includes at least one metallic element in the form of a pure metal (i.e., a metal atom), a metallic ion, a metal compound (e.g., a metal oxide, a metal nitride, a metal oxynitride, a metal silicide, a metal carbide, etc.), a metal alloy (e.g., a combination of multiple metallic elements), or a combination thereof. In some embodiments, the core group 204 includes a metallic element selected from the following: zirconium, lanthanum, manganese, copper, tantalum, tungsten, hafnium, tin, aluminum, titanium, copper, cobalt, or other suitable elements. In some embodiments, the core group 204 may include a metallic oxide (e.g., zirconium oxide) or a pure metal atom (e.g., tin atom). In some embodiments, the core group 204 includes a positively charged metallic ion.

The ligands 212 may be the same or different from one another. In some embodiments, the ligands may include a straight or cyclic alkyl, alkoxyl, carboxylic acid, alkene, or other functional groups each having 1 to 12 carbon atoms. In the depicted embodiment, the structure 200 includes the core group 204 and multiple ligands 212 (embodiments are not limited to four ligands 212 as depicted in FIG. 4) organized into a particle (i.e., cluster).

The inventors of the present disclosure have discovered that metallic photoresist materials may have problems related to aging. For example, as time passes (e.g., aging), the ligands 212 of the metallic photoresist may become unstable and may get dropped or separated. In other words, the metallic photoresist materials may lose one or more of the ligands 212 over time. The "dropped" ligands are also illustrated in FIG. 4. As a result, the metallic photoresist materials undergo a chemical change. For example, as the ligands 212 dissociate from the core groups 204 due to aging, a larger particle (i.e., structure 220) is formed that comprises multiple (e.g., two or more) core groups 204 and ligands 212 surrounding the core groups 204. This is undesirable and may degrade the performance of the metallic photoresist material.

In addition to aging, the inventors of the present disclosure also discovered another problem associated with metallic photoresist materials, which is critical dimension (CD) control. For example, the critical dimension of the metallic photoresist materials may vary unacceptably if the metallic photoresist materials come from different batches, even if these different batches are supplied by the same supplier/vendor. If the metallic photoresist materials come from different vendors, then the critical dimension control issue may become even worse. As semiconductor fabrication progresses into ever smaller technology nodes, poor critical dimension control may lead to semiconductor devices with degraded performance, or possibly even device failures.

To combat the aging and/or critical dimension control issues discussed above, the inventors of the present disclosure have configured the metallic photoresist material of the photoresist layer by adding one or more additives to the metallic photoresist material. In other words, the photoresist layer 160 includes the metallic photoresist material and one or more additives. The additives substantially improve the aging and/or critical dimension control problems, as discussed below in more detail.

Figure 5:
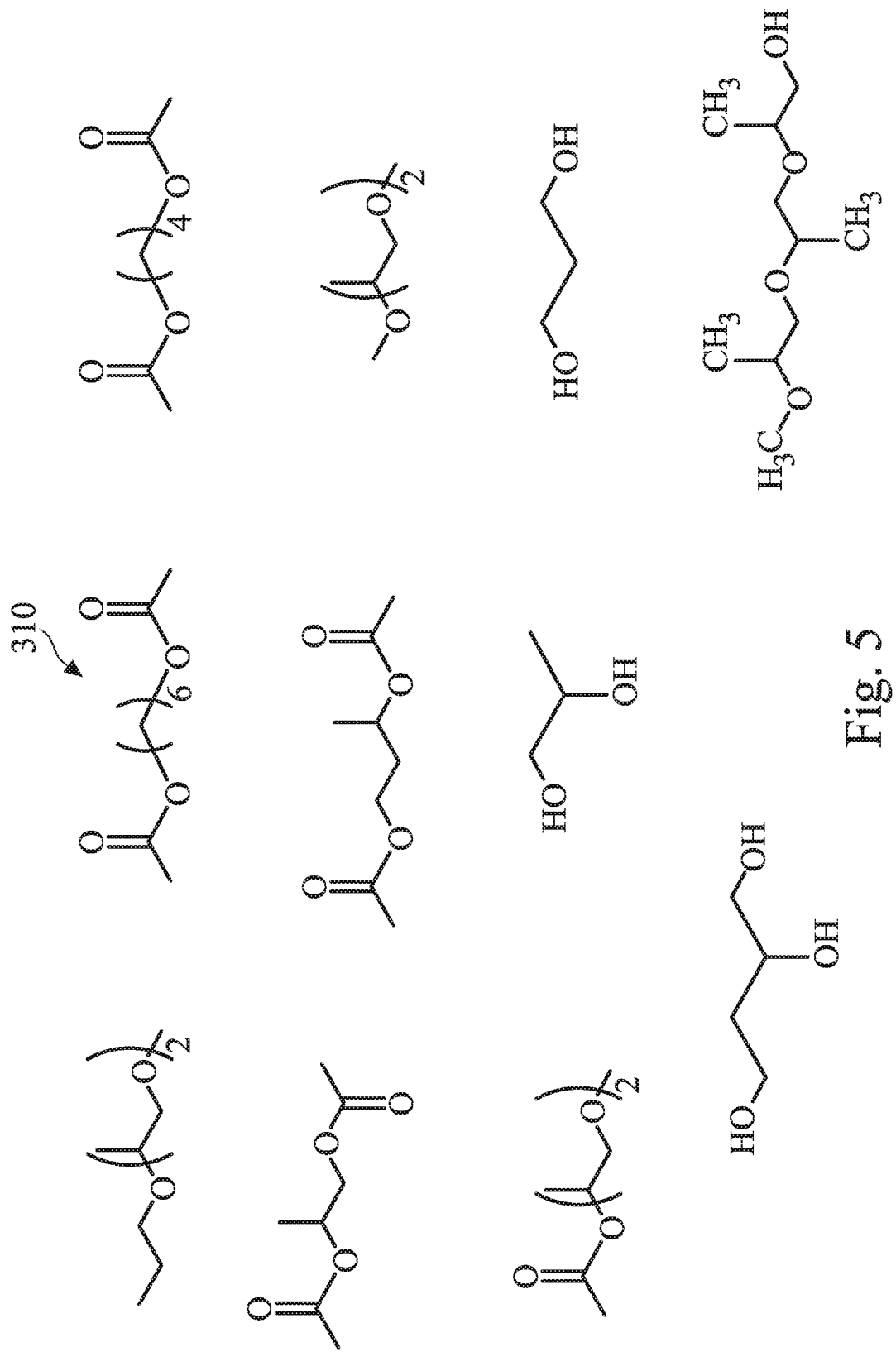
Figure 6:
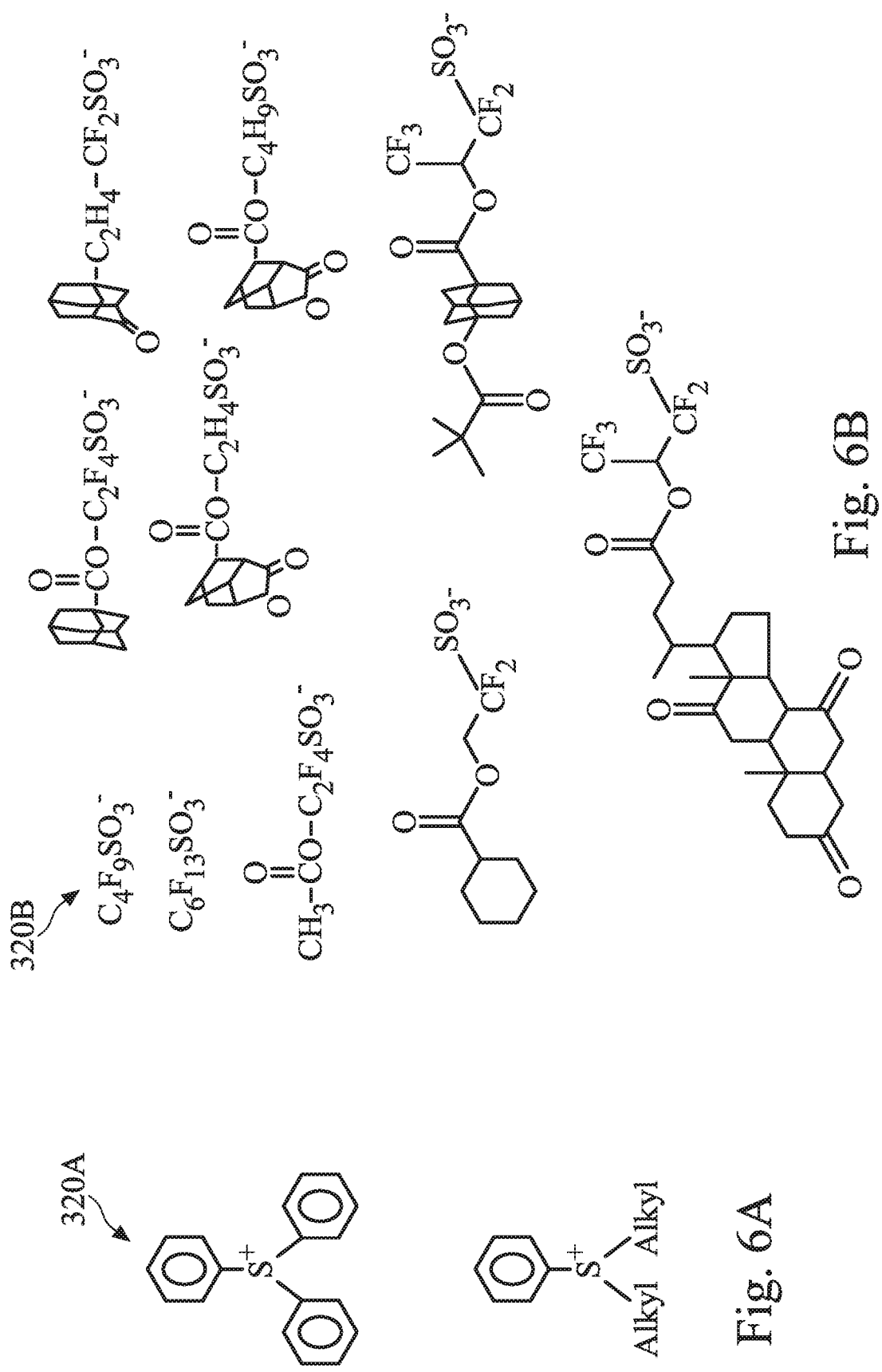

Referring to FIG. 5, in some embodiments, one additive includes a high boiling point solvent 310. In some embodiments, a concentration of the high boiling point solvent 310 in the photoresist layer 160 is in a range between about 1% and about 20%, for example between about 3% and about 15%. The high point boiling solvent 310, with this specifically configured concentration range, prevents or alleviates the aging problem of metallic photoresist materials. In some embodiments, the high boiling point solvent 310 has a boiling point temperature that is greater than about 150 degrees Celsius.

In some embodiments, the high boiling point solvent 310 includes cyclohexyl acetate (CHAX), dimethoxymethane (DMM), propylene glycol diacetate (PGDA), dipropylene glycol methyl-n-propyl (DPMNP), dipropylene glycol methyl ether acetate (DPMA), 1,4-butanediol diacrylate (1,4-BDDA), 1,3-butylene glycol diacetate (1,3-BGDA), 1,6-hexanediol diacrylate (1,6-HDDA), tripropylene glycol methyl ether (TPM), 1,3-propanediol, propylene glycol, or combinations thereof. In various embodiments, the high boiling point solvent 310 may have one of the following chemical compositions or chemical formulas (also shown in FIG. 5):

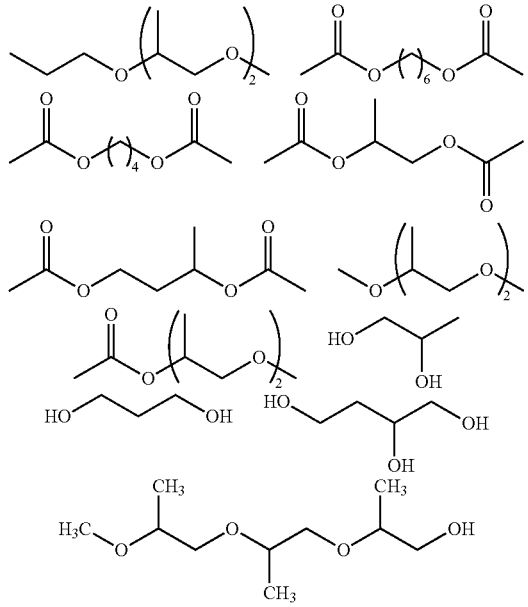

Referring to FIGS. 6A-6B, in some embodiments, the additive includes a photo acid generator (PAG). Due to the addition of the PAG, after exposure or thermal treatment, acid would diffuse around a surface area of the photoresist layer 160. In some embodiments, a concentration of the PAG in the photoresist layer 160 is in a range between about 0.01% and about 10%, for example between about 1% and about 10%. The PAG, with this specifically configured concentration range, prevents or alleviates the aging problem and/or the CD control problem of metallic photoresist materials.

The PAG includes a cation 320A (shown in FIG. 6A) and an anion 320B (shown in FIG. 6B). In some embodiments, the cation 320A may have one of the following chemical formulas:

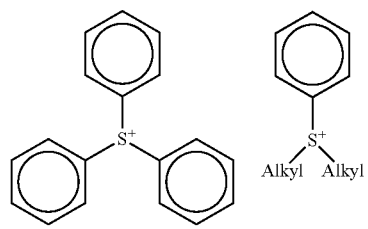

In some embodiments, the anion 320B may have one of the following chemical formulas:

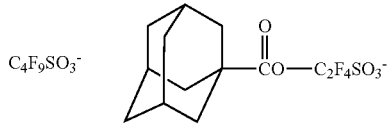

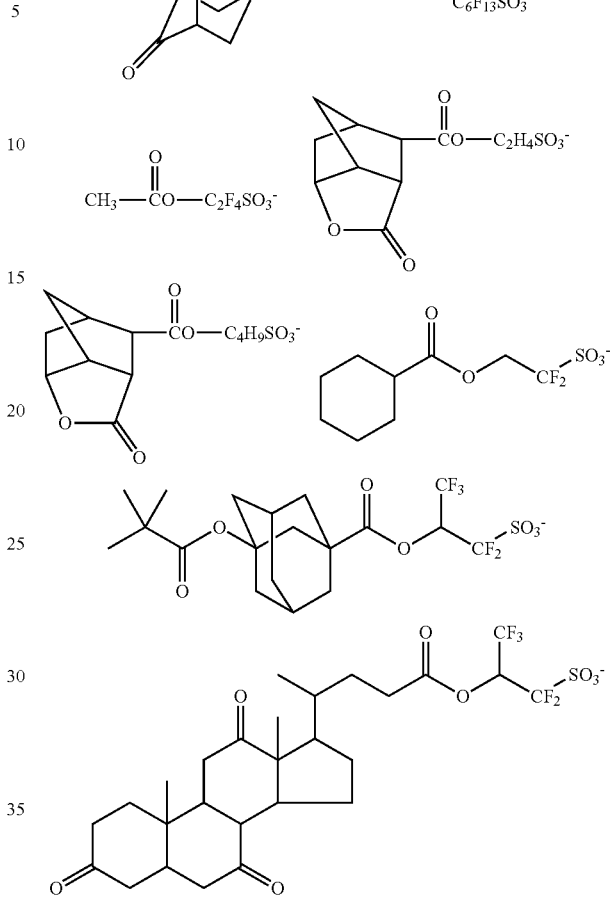

Figure 7:
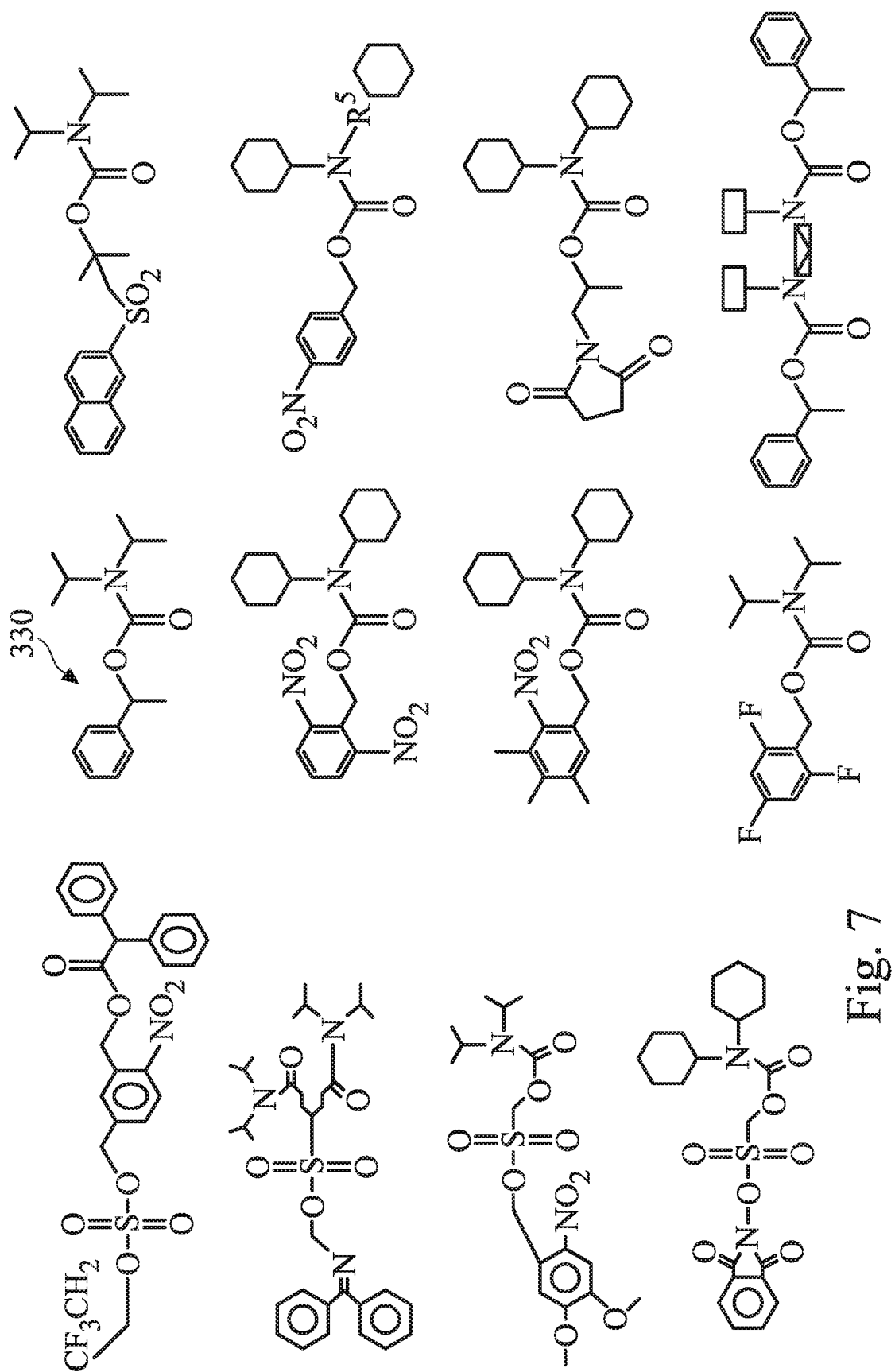

Referring to FIG. 7, in some embodiments, the additive includes a photo base generator (PBG) 330. In some embodiments, a concentration of the PBG in the photoresist layer 160 is in a range between about 0.01% and about 10%, for example between about 0.1% and about 5%. The PBG, with this specifically configured concentration range, prevents or alleviates the aging problem and/or the CD control problem of metallic photoresist materials. In some embodiments, the PBG may have one of the following chemical formulas:

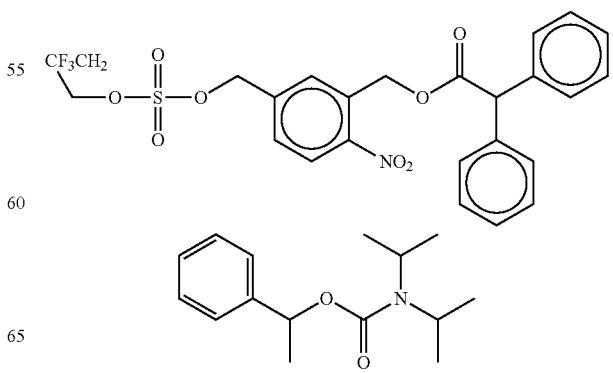

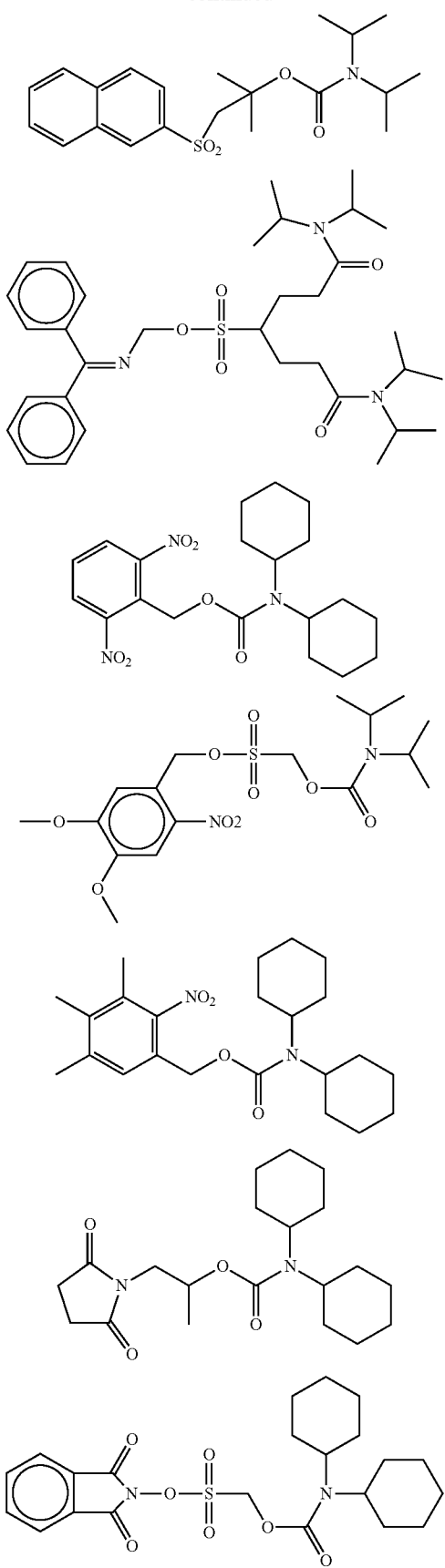

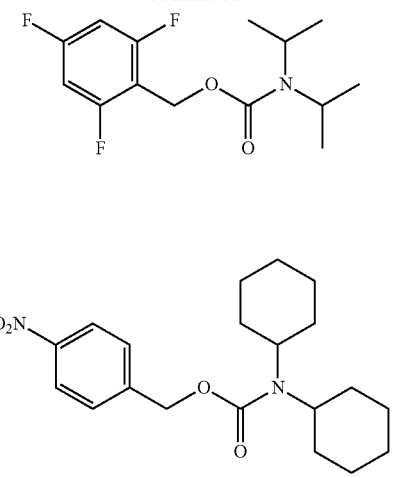

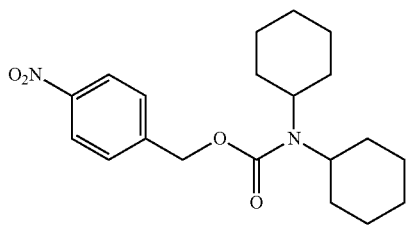

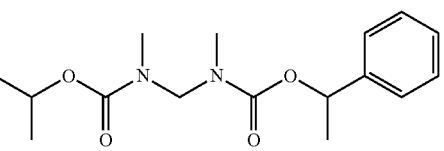

Figure 8:
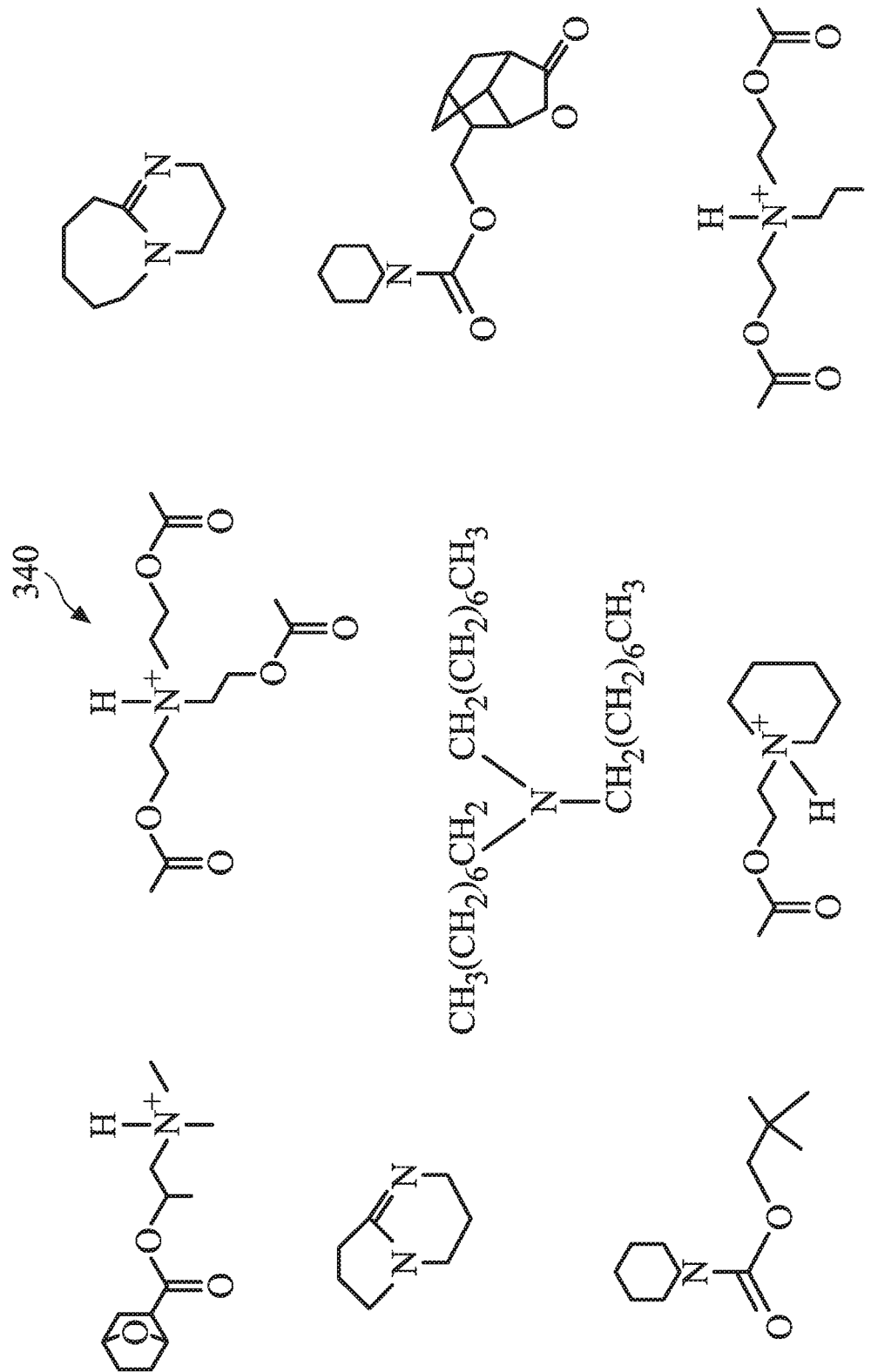

Referring to FIG. 8, in some embodiments, the additive includes a quencher 340. In some embodiments, a concentration of the quencher in the photoresist layer 160 is in a range between about 0.01% and about 10%, for example between about 0.1% and about 5%. The quencher, with this specifically configured concentration range, prevents or alleviates the aging problem and/or the CD control problem of metallic photoresist materials. In some embodiments, the quencher may have one of the following chemical formulas:

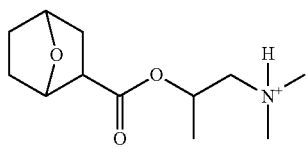

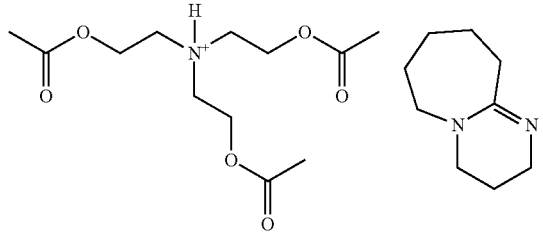

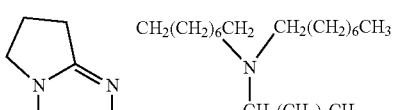

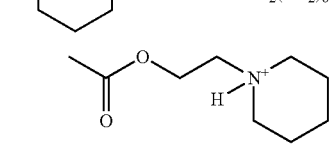

-continued

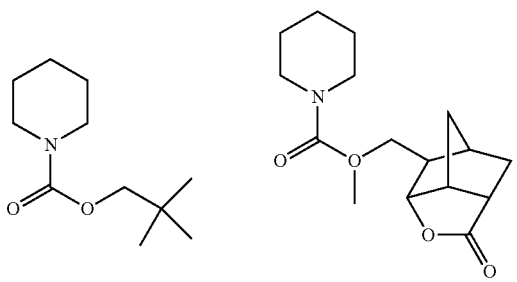

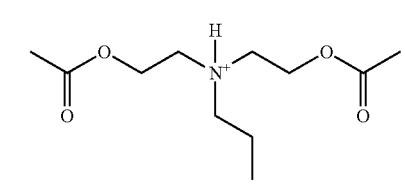

In some embodiments, the additive includes a photo decomposed base 350. In some embodiments, a concentration of the photo decomposed base 350 in the photoresist layer 160 is in a range between about 0.01% and about 10%, for example between about 0.1% and about 5%. The photo decomposed base 350, with this specifically configured concentration range, prevents or alleviates the aging problem and/or the CD control problem of metallic photoresist materials. In some embodiments, the photo decomposed base 350 may be represented by the following general chemical formula (shown in FIG. 9A):

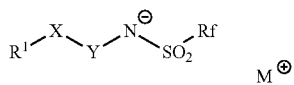

In the above chemical formula, R1 represents an alicyclic group of 5 or more carbon atoms which may have a substituent; X represents a divalent linking group; Y represents a linear, branched, or cyclic alkylene group or an arylene group; Rf represents a hydrocarbon group containing a fluorine atom; and M$^+$ represents an organic cation or a metal cation. In some embodiments, the cation may have one of the following chemical formulas (also shown in FIG. 9B):

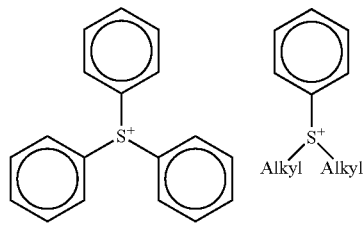

In some embodiments, the photo decomposed base also includes an anion, which is represented by N$^\ominus$ in the chemical formula shown in FIG. 9A. The anion may have one of the following chemical formulas (also shown in FIG. 9C):

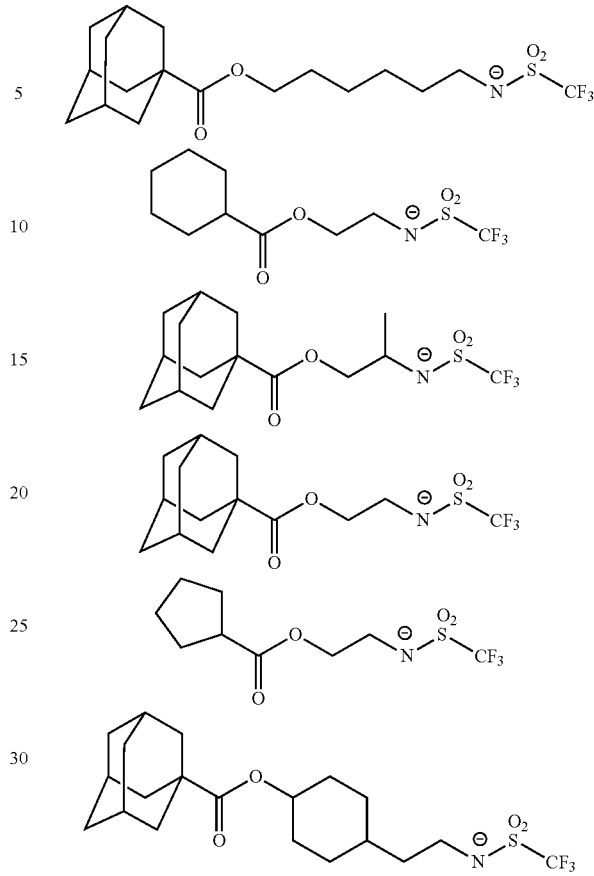

where the ⊖N in the above chemical formulas represents nitrogen, specifically, negatively charged nitrogen (where the negative charge is represented by ⊖).

Figure 10:
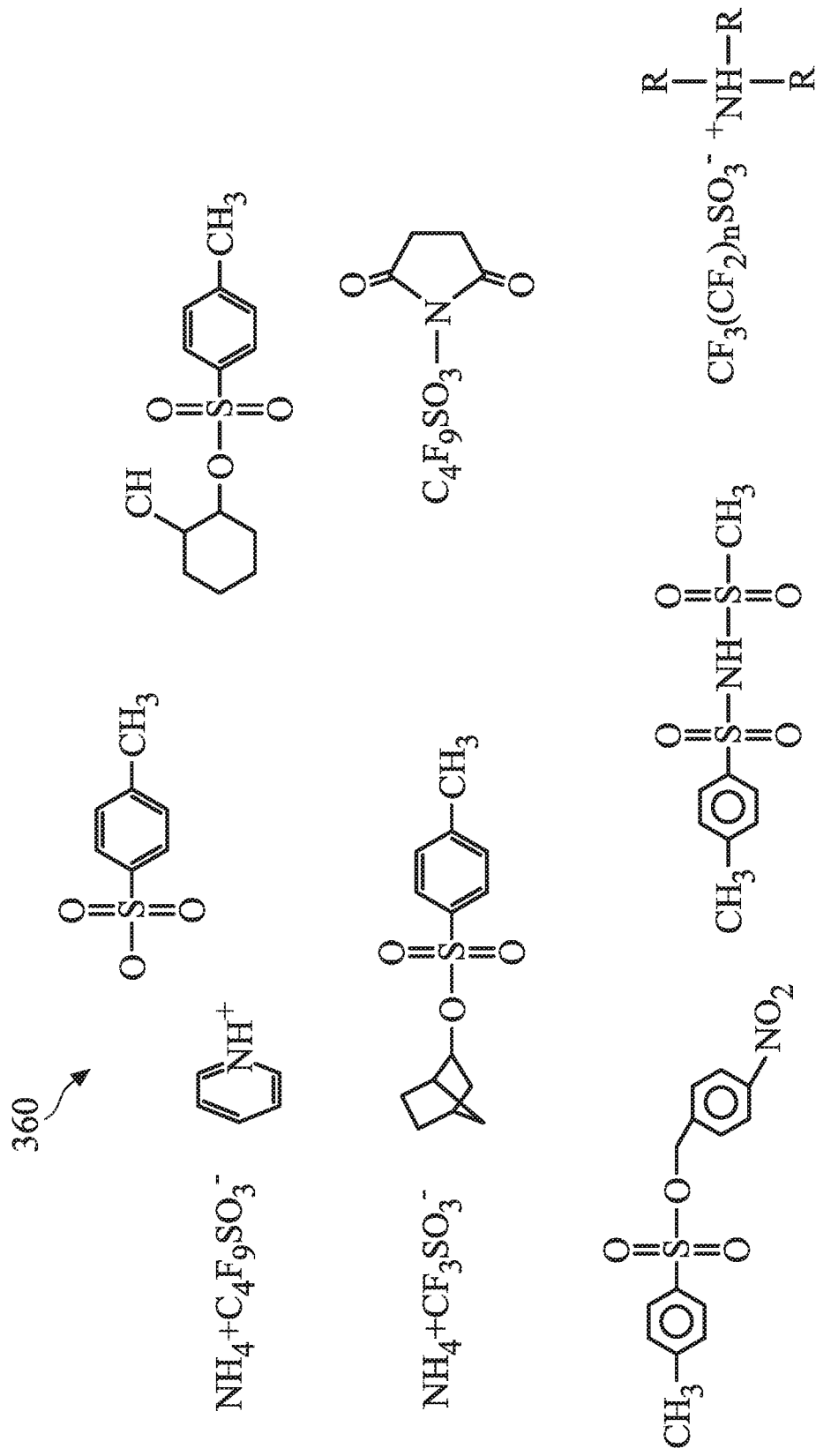
Figure 11A:
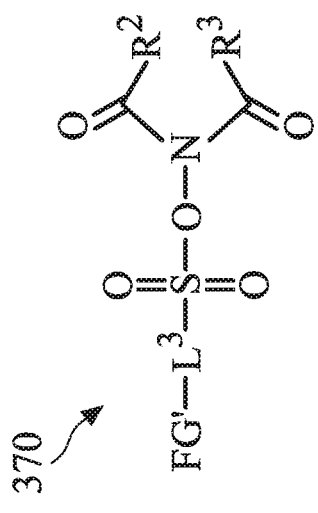
Figure 11B:
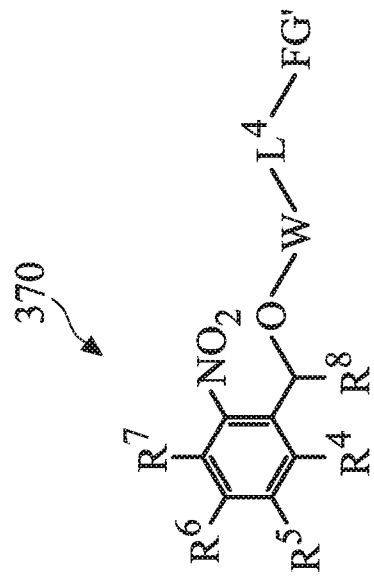

Referring now to FIG. 10, in some embodiments, the additive includes a thermal acid generator (TAG) 360. In some embodiments, the TAG 360 has a loading that is about 1%-10% weight percentage to the metallic resist. In some embodiments, the TAG 360 has a reactive temperature that is within about plus or minus 20 degrees Celsius of a post exposure baking (PEB) temperature of the photoresist layer 160 (the PEB process will be performed in a subsequent step). In some embodiments, a concentration of the TAG 360 in the photoresist layer 160 is in a range between about 0.01% and about 10%. The TAG 360, with this specifically configured concentration range, prevents or alleviates the aging problem and/or the CD control problem of metallic photoresist materials. In some embodiments, the TAG has one of the following chemical formulas:

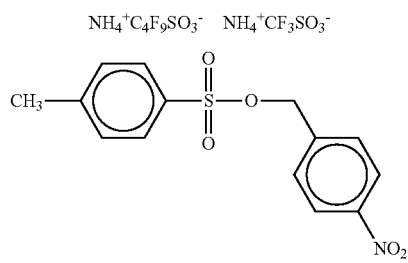

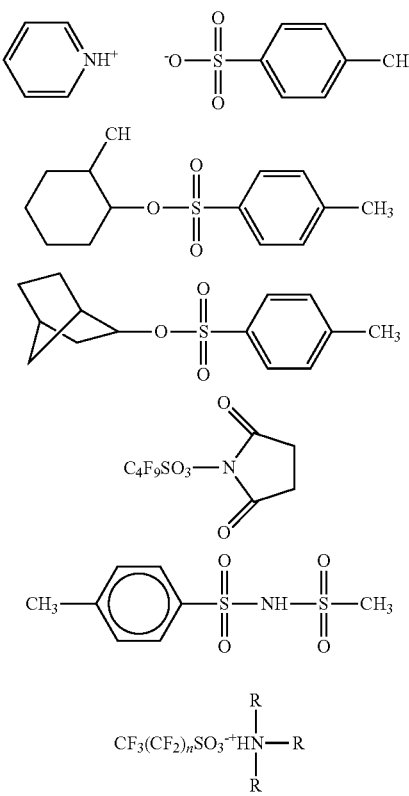

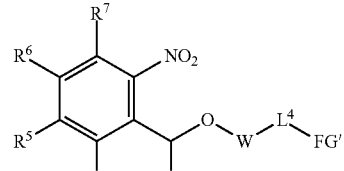

Wherein FG' represents the first functional group selected from primary amines, secondary amines, hydroxyls, amides, esters, epoxies, episulfides, or anhydrides; wherein W is selected from a carbonyl (C=O) group or a sulfonyl (SO2) group; wherein $L^4$ is a linking group convalently bonding FG' to W; and wherein $R^4$, $R^5$, $R^6$, $R^7$, and $R^8$ are independently selected from H; a halide; a substituted or unsubstituted alkyl, cycloalkyl, aryl, alkaryl, or ether groups; a haloalkyl; a heteroaryl; an alkoxyl; or combinations thereof, provided that at least one of $R^4$, $R^5$, $R^6$, $R^7$, and $R^8$ comprises a functional group selected from primary amines, secondary amines, hydroxyls, amides, esters, epoxies, episulfides, and anhydrides.

Referring now to FIG. 12, a developing process 500 is performed to pattern the photoresist layer 160. Assuming a positive-tone photoresist is used, exposed portions of the photoresist layer 160 are removed after the developing process 500, as the exposure to the EUV light changes the chemical structure of the photoresist and makes it more soluble in the developer solution. Meanwhile, the unexposed portions of the photoresist layer 160 remain, thereby forming openings 510 in place of the removed portions. On the other hand, if the photoresist layer 160 had been a negative-tone photoresist, then the exposed portions would have remained after the developing process 500, while the unexposed portions would have been removed. In any case, the pattern photoresist layer 160 can now be used to pattern the material layer 150 therebelow in subsequent fabrication processes. In some embodiments, a lateral dimension 530 of the openings 510 may define the critical dimension (CD) of features of the semiconductor device 100. In other embodiments, a lateral dimension 540 of a component of the patterned photoresist layer 160 may define the CD of features of the semiconductor device 100.

Referring now to FIG. 13, a patterning process 600 is performed to pattern the material layer 150. The photoresist layer 160 serves as a mask for patterning the material layer 150. The dimensions 530 and 540 are transferred to the material layer 150. As discussed above, the various additives added to the metallic photoresist layer 160 allows the CD control to be tighter (e.g., achieving smaller CD variations). In addition, the aging problem discussed above is substantially alleviated, which also improves the performance of the photoresist layer 160.

Figure 14:
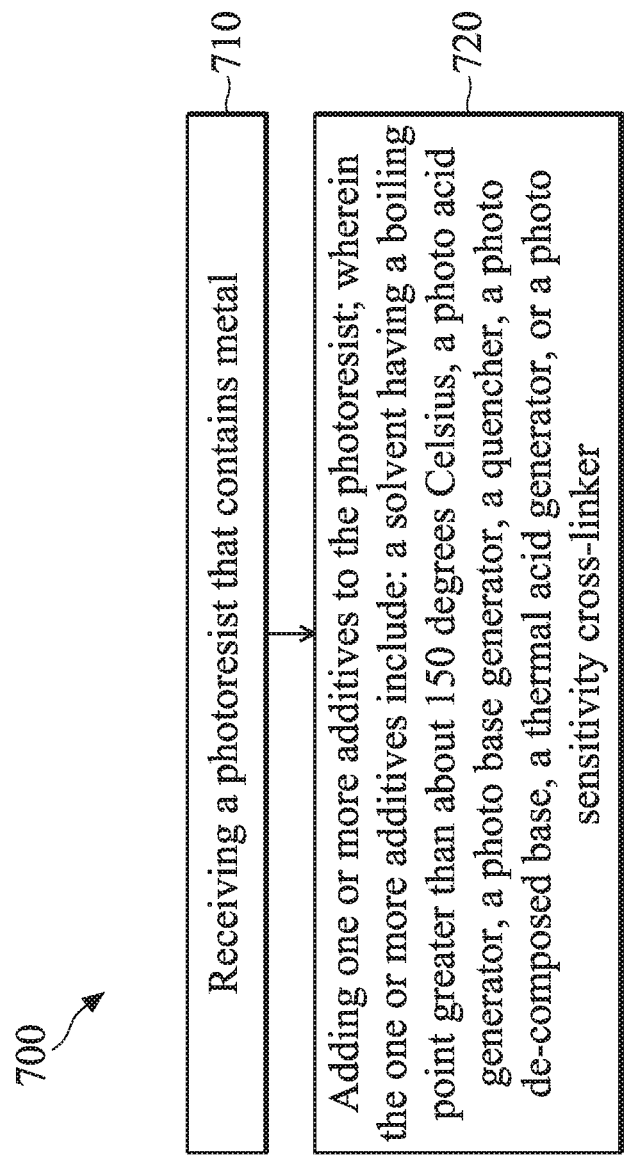
FIG. 14 is a flowchart of a method of fabricating a semiconductor device in accordance with some embodiments of the present disclosure.

FIG. 14 is a flowchart illustrating a simplified method 700 of fabricating a semiconductor device. The method 700 includes a step 710 of receiving a photoresist that contains metal. For example, the photoresist may be an EUV metallic photoresist. In some embodiments, the metallic photoresist has a structure that includes a core group surrounded by multiple ligands (e.g., shown in FIG. 4). At least some of the ligands separate from the core group as a result of aging.

The method 700 includes a step 720 of adding one or more additives to the photoresist. The one or more additives include: a solvent having a boiling point greater than about 150 degrees Celsius, a photo acid generator, a photo base generator, a quencher, a photo de-composed base, a thermal Referring now to FIGS. 11A-11B, in some embodiments, the additive includes a photo sensitivity cross-linker 370. In some embodiments, a concentration of the photo sensitivity cross-linker 370 in the photoresist layer 160 is in a range between about 0.01% and about 10%, for example between about 1% and about 10%. The photo sensitivity cross-linker 370, with this specifically configured concentration range, prevents or alleviates the CD control problem of metallic photoresist materials. In some embodiments, the quencher may have the following chemical formula (also shown in FIG. 11A):

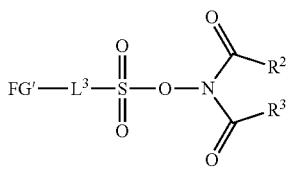

Wherein FG' represents the first functional group selected from primary amines, secondary amines, hydroxyls, amides, esters, epoxies, episulfides, or anhydrides; where $L^3$ is a linking group convalently bonding FG' to a sulfo($SO_2$) group; wherein $R^2$ and $R^3$ can be the same or different carbon-containing moiety, or in combination form a carbon-containing ring, provided that at least one of $R^2$ and $R^3$ or the carbon-containing ring is substituted with at least one FG'.

In some embodiments, the quencher may have the following chemical formula (also shown in FIG. 11B):

acid generator, or a photo sensitivity cross-linker. The chemical formulas of these additives are discussed above in association with FIGS. 5-11.

In some embodiments, the method 700 is performed by a photoresist vendor/supplier that manufactures the metallic photoresist. In other embodiments, the method 700 is performed by a semiconductor manufacturer, which receives the metallic photoresist manufactured by the vendor/supplier (without the additives added therein), and the semiconductor manufacturer adds the one or more additives to the metallic photoresist.

It is understood that additional fabrication processes may be performed before, during, or after the steps 710-720 of FIG. 14. For example, the method 700 may include a step of performing an extreme ultraviolet (EUV) lithography process using the photoresist after the one or more additives have been added to the photoresist.

Figure 15:
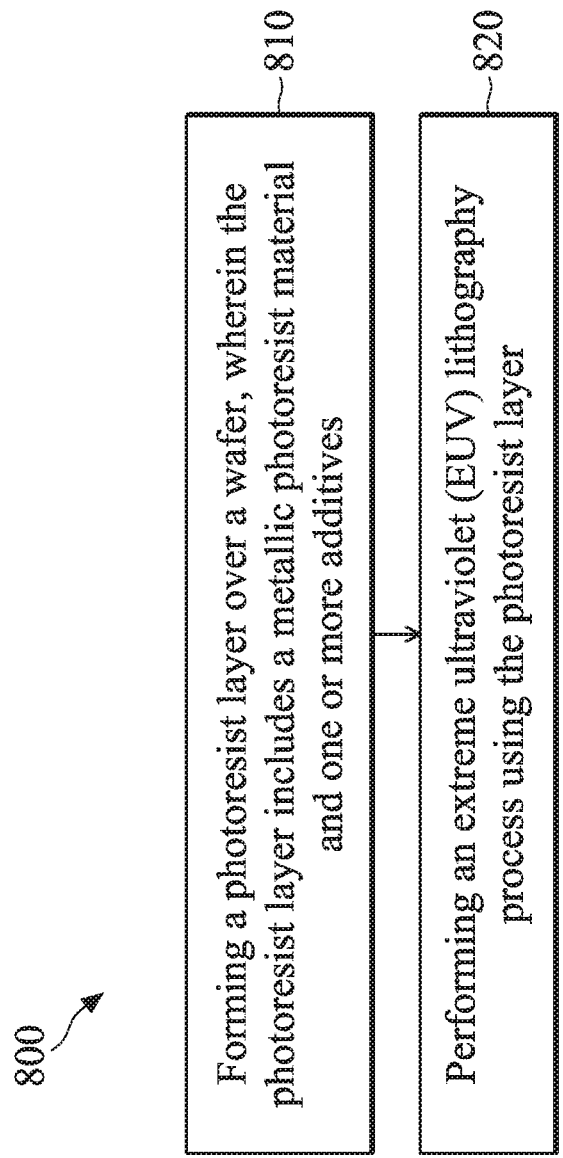
FIG. 15 is a flowchart of a method of fabricating a semiconductor device in accordance with some embodiments of the present disclosure.

FIG. 15 is a flowchart illustrating a simplified method 800. The method 800 includes a step 810 of forming a photoresist layer over a wafer. The photoresist layer includes a metallic photoresist material and one or more additives. In some embodiments, the one or more additives include: a solvent having a boiling point greater than about 150 degrees Celsius, a photo acid generator, a photo base generator, a quencher, a photo de-composed base, a thermal acid generator, or a photo sensitivity cross-linker The method 800 includes a step 820 of performing an extreme ultraviolet (EUV) lithography process using the photoresist layer.

In some embodiments, the solvent has a chemical formula discussed above in association with FIG. 5.

In some embodiments, the photo acid generator has a chemical formula discussed above in association with FIGS. 6A-6B.

In some embodiments, the photo base generator has a chemical formula discussed above in association with FIG. 7.

In some embodiments, the quencher has a chemical formula discussed above in association with FIG. 8.

In some embodiments, the photo de-composed base has a chemical formula discussed above in association with FIGS. 9A-9C.

In some embodiments, the thermal acid generator has a chemical formula discussed above in association with FIG. 10.

In some embodiments, the photo sensitivity cross-linker has a chemical formula discussed above in association with FIGS. 11A-11B.

It is understood that additional fabrication processes may be performed before, during, or after the steps 810-820 of FIG. 15. For example, the method 800 may include semiconductor fabrication processes such as ion implantation, deposition, etching, etc. These other processes are not discussed in detail herein for reasons of simplicity.

Based on the above discussions, it can be seen that the present disclosure offers various advantages in EUV lithography. It is understood, however, that not all advantages are necessarily discussed herein, and other embodiments may offer different advantages, and that no particular advantage is required for all embodiments. One of the advantages is better aging performance of the EUV metallic photoresist. By adding one or more of the additives discussed above, the problem of the ligands separating from the core structure is substantially alleviated. As a result, the EUV metallic photoresist (with the additives added therein) may have significantly longer shelf life (e.g., by 1 month or more) compared to conventional EUV metallic photoresist that does not have the additives added therein. Another of the advantages is better CD control. By adding one or more of the additives discussed above, the CD control of metallic photoresist can be tightened to within 10% variation of a CD target. Another advantage is that the processes discussed herein are compatible with existing fabrication process flow and are easy to implement.

The present disclosure provides a material. The material includes: a metallic photoresist material for an extreme ultraviolet (EUV) lithography, as well as an additive. The additive includes: a solvent having a boiling point greater than about 150 degrees Celsius, a photo acid generator, a photo base generator, a quencher, a photo de-composed base, a thermal acid generator, or a photo sensitivity cross-linker.

The present disclosure also provides a method. A photoresist layer is formed over a wafer. The photoresist layer includes a metallic photoresist material and one or more additives. An extreme ultraviolet (EUV) lithography is performed process using the photoresist layer. The one or more additives include: a solvent having a boiling point greater than about 150 degrees Celsius, a photo acid generator, a photo base generator, a quencher, a photo de-composed base, a thermal acid generator, or a photo sensitivity cross-linker.

The present disclosure further provides a method. A photoresist is received that contains metal. One or more additives are added to the photoresist. The one or more additives include: a solvent having a boiling point greater than about 150 degrees Celsius, a photo acid generator, a photo base generator, a quencher, a photo de-composed base, a thermal acid generator, or a photo sensitivity cross-linker.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A material, comprising:
a metallic photoresist material for an extreme ultraviolet (EUV) lithography; and
a solvent having a boiling point greater than about 150 degrees Celsius, wherein the solvent has a chemical formula selected from the group consisting of:

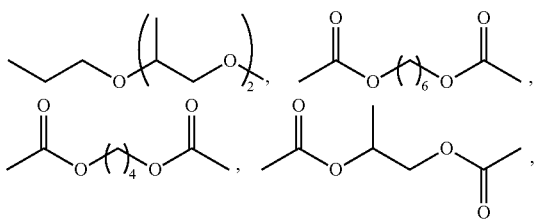

-continued

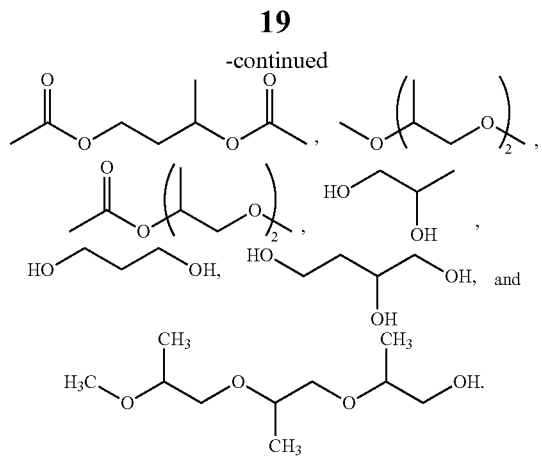

2. The material of claim 1, further comprising a photo acid generator, wherein the photo acid generator includes a cation component and an anion component, wherein the cation component has a chemical formula selected from the group consisting of:

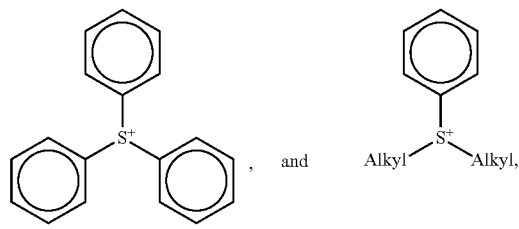

and wherein the anion component has a chemical formula selected from the group consisting of:

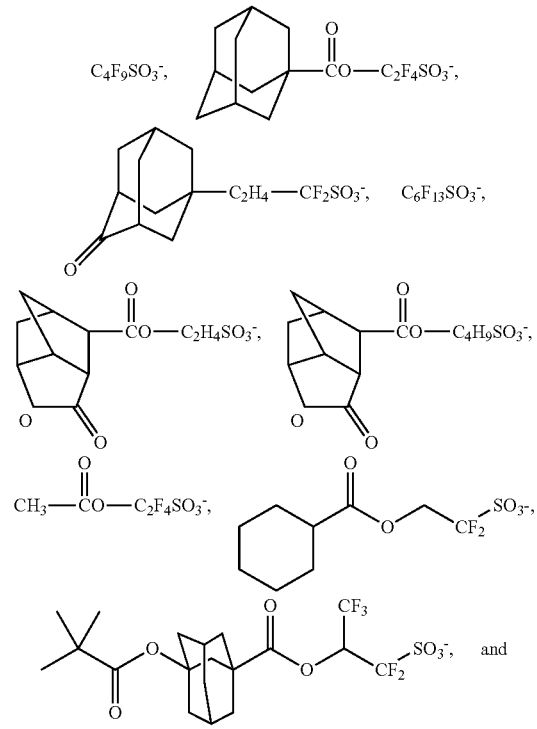

-continued

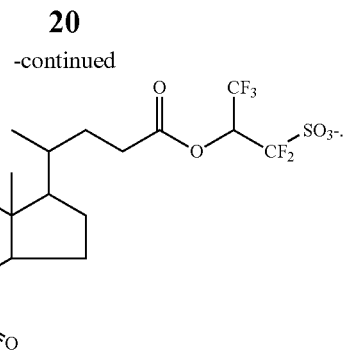

3. The material of claim 1, further comprising a photo base generator, wherein the photo base generator has a chemical formula selected from the group consisting of:

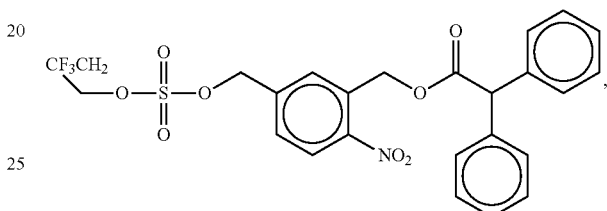

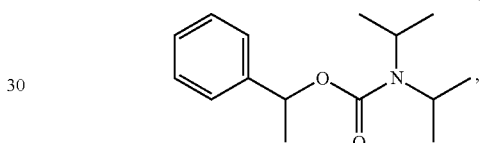

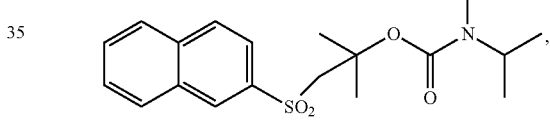

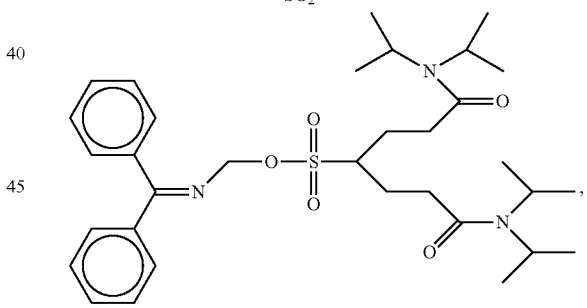

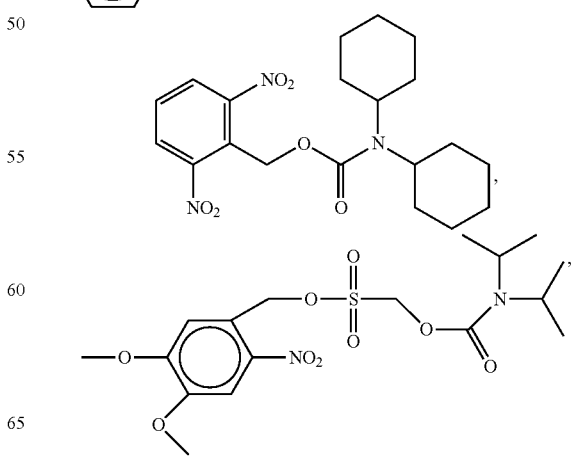

-continued

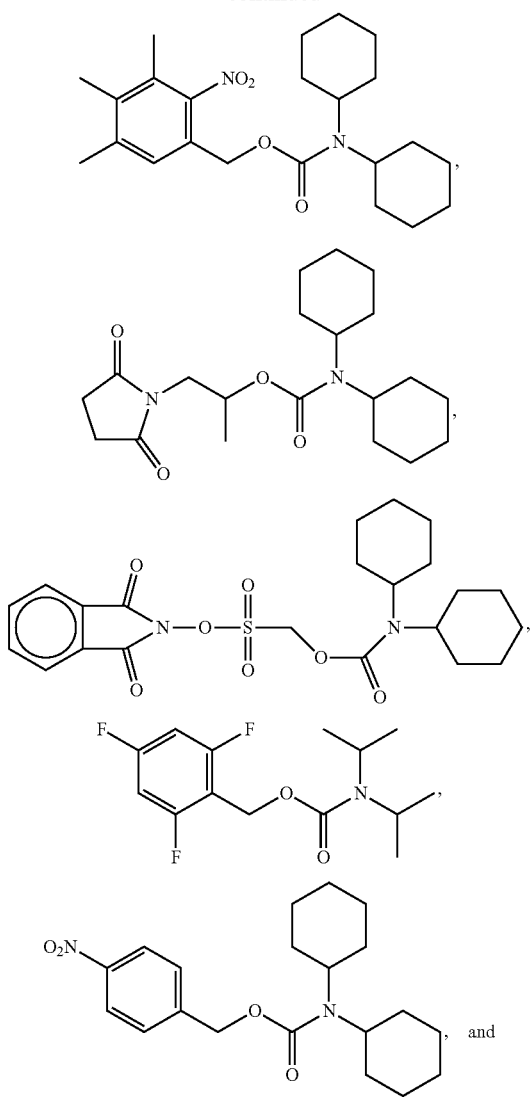

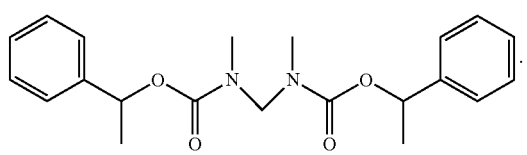

4. The material of claim 1, further comprising a quencher, wherein the quencher has a chemical formula selected from the group consisting of:

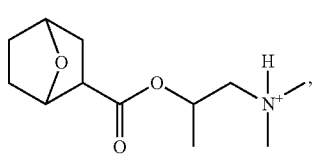

-continued

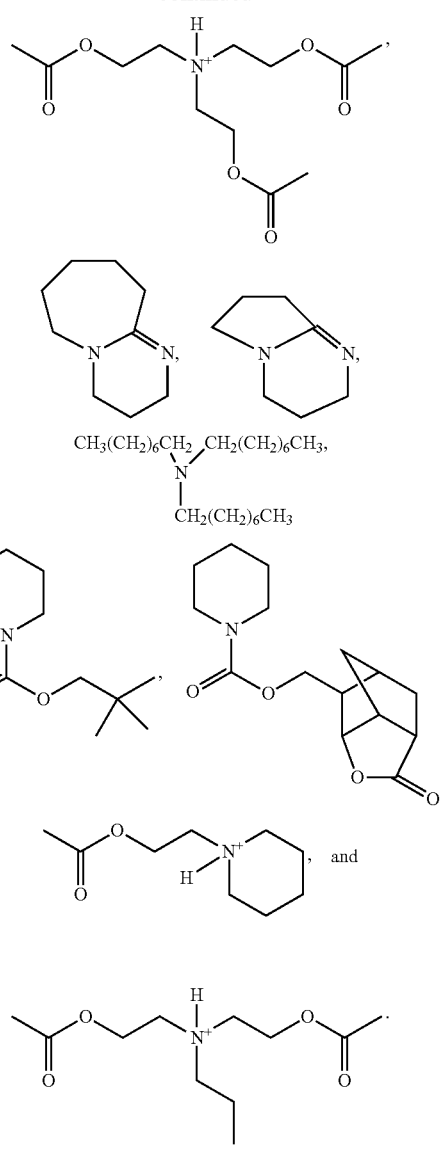

5. The material of claim 1, further comprising a photo de-composed base, wherein the photo de-composed base includes a cation component and an anion component, wherein the cation component has a chemical formula selected from the group consisting of:

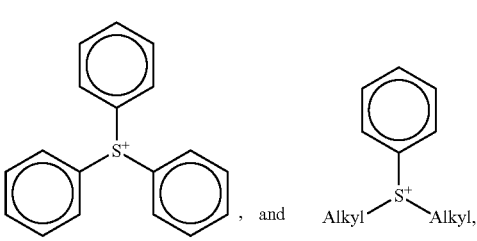

and wherein the anion component has a chemical selected from the group consisting of:

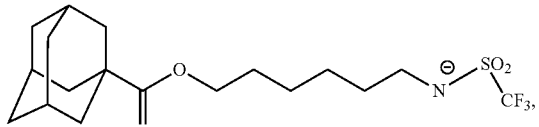

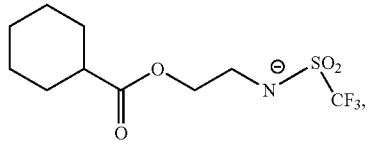

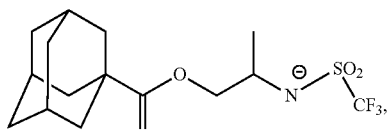

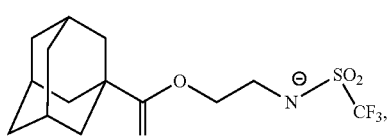

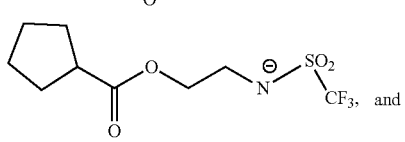

and

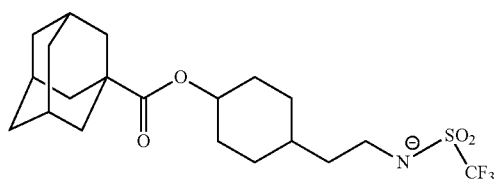

6. The material of claim 1, further comprising a thermal acid generator, wherein the thermal acid generator has a chemical selected from the group consisting of:

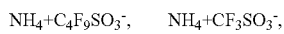

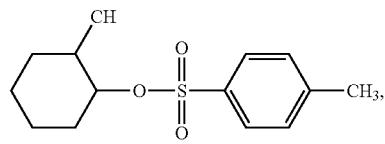

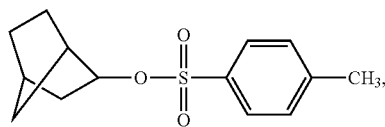

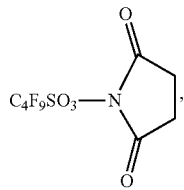

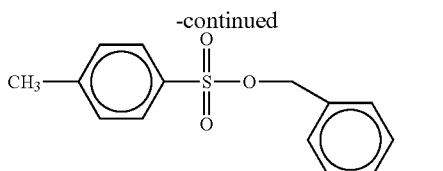

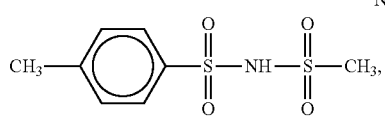

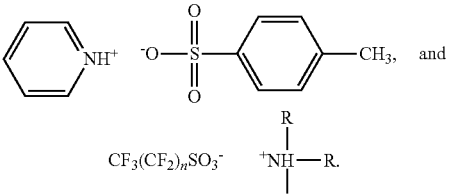

and

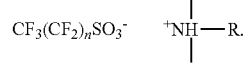

7. The material of claim 1, further comprising a photo sensitivity cross-linker, wherein the photo sensitivity cross-linker has a chemical selected from the group consisting of:

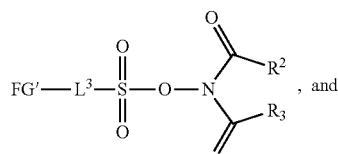, and

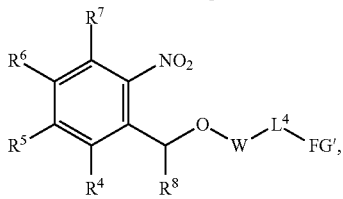

wherein:
FG' represents primary amines, secondary amines, hydroxyls, amides, esters, epoxies, episulfides, or anhydrid;
W represents a carbonyl (C=O) group or a sulfonyl (SO2) group;
$L^3$ represents a linking group covalently bonding FG' to a sulfo($SO_2$) group;
$L^4$ is a linking group covalently bonding FG' to W;
$R^2$ and $R^3$ each represents a carbon-containing moiety or in combination form a carbon-containing ring, provided that at least one of $R^2$ and $R^3$ or the carbon-containing ring is substituted with at least one FG'; and
$R^4$, $R^5$, $R^6$, $R^7$, and $R^8$ each represents: H, a halide, a substituted or unsubstituted alkyl, cycloalkyl, aryl, alkaryl, ether groups, a haloalkyl, a heteroaryl, or an alkoxyl, provided that at least one of $R^4$, $R^5$, $R^6$, $R^7$, and $R^8$ comprises primary amines, secondary amines, hydroxy amides, esters, epoxies, episulfides, or anhydrides.

8. A method, comprising:
forming a photoresist layer over a wafer, wherein the photoresist layer includes a metallic photoresist material and a photo acid generator; and
performing an extreme ultraviolet (EUV) lithography process using the photoresist layer;

wherein the photo acid generator includes a cation component and an anion component, wherein the cation component has a chemical formula selected from the group consisting of:

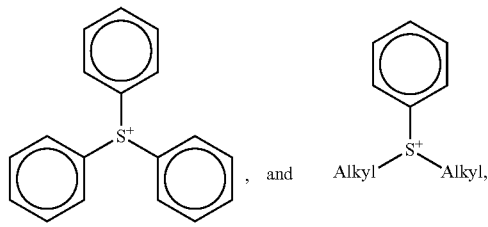

and wherein the anion component has a chemical formula selected from the group consisting of:

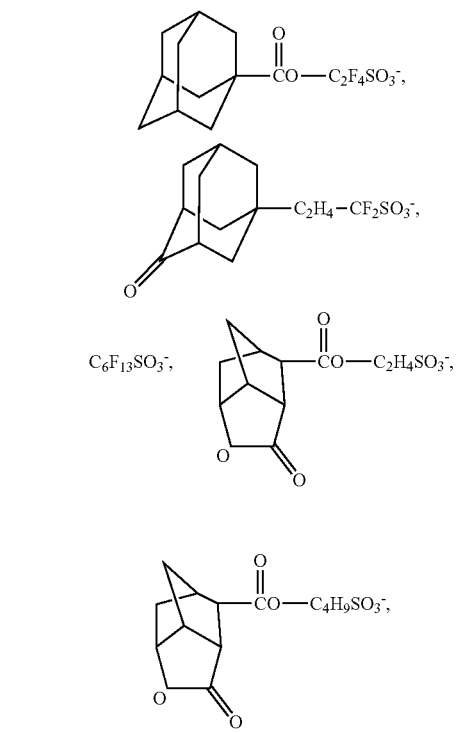

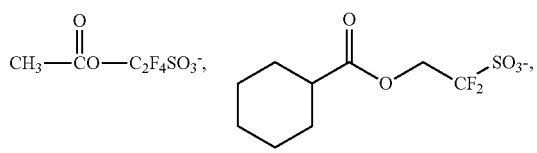

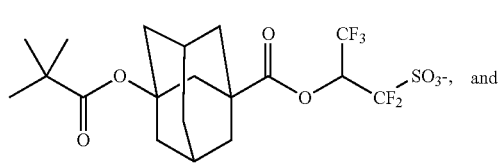

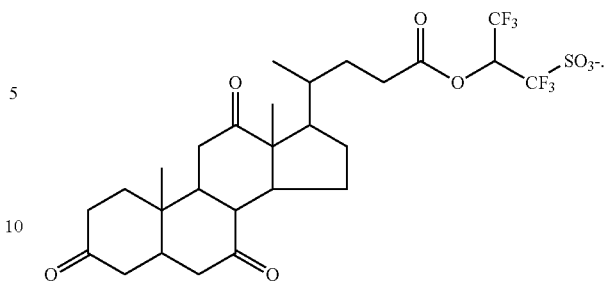

9. The method of claim 8, wherein the photoresist layer further includes a solvent, and wherein the solvent has a chemical formula selected from the group consisting of:

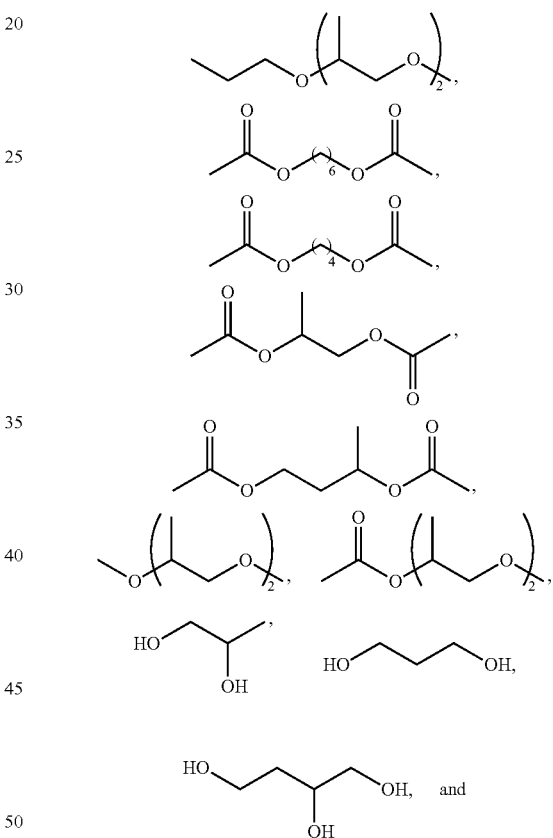

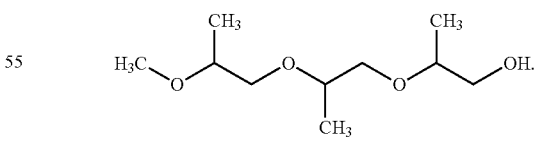

10. The method of claim 9, wherein a concentration of the solvent in the photoresist layer is in a range between about 1% and about 20%.

11. The method of claim 8, wherein the photoresist layer further includes a photo base generator, wherein the photo base generator has a chemical formula selected from the group consisting of:

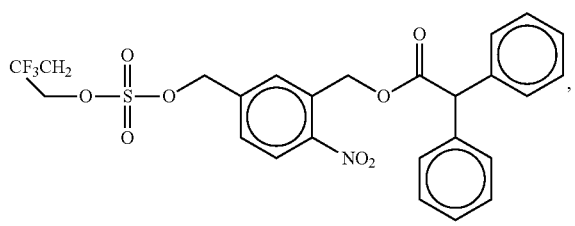
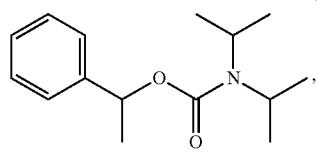
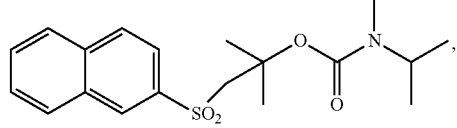
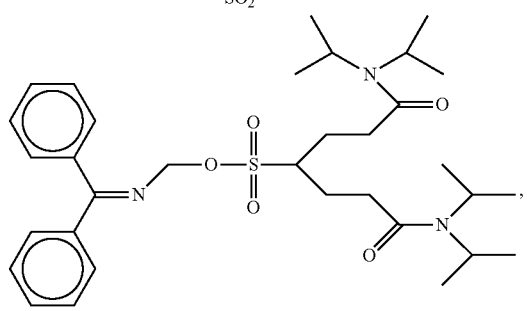
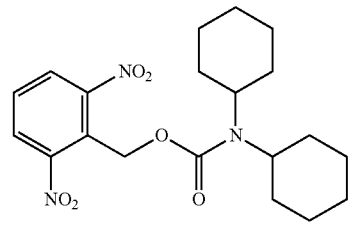
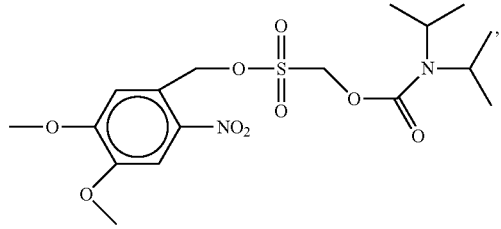
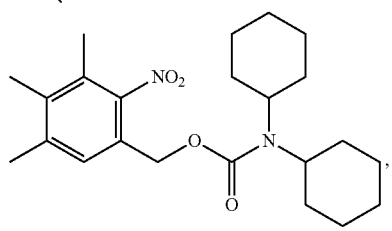
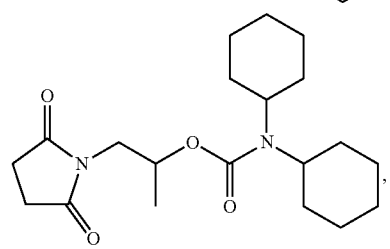
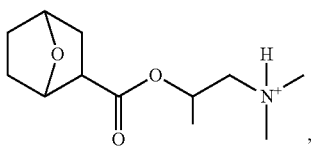
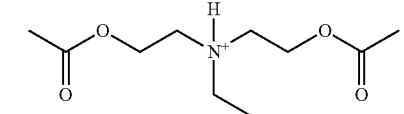
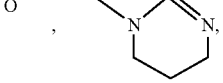
12. The method of claim 8, wherein the photoresist layer further includes a quencher, wherein the quencher has a chemical formula selected from the group consisting of:
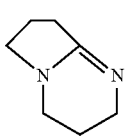
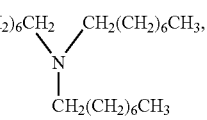
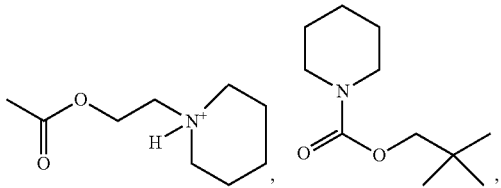

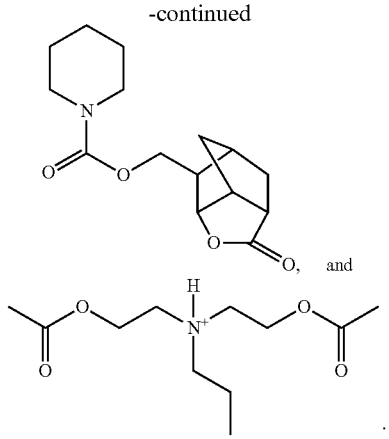

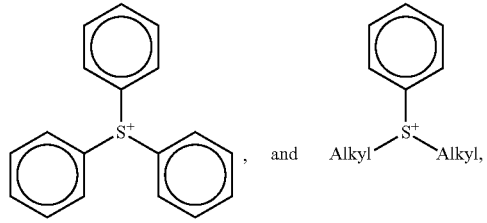

13. The method of claim 8, wherein the photoresist layer further includes a photo decomposed base, wherein the photo decomposed base includes a cation component and an anion component, wherein the cation component has a chemical formula selected from the group consisting of:

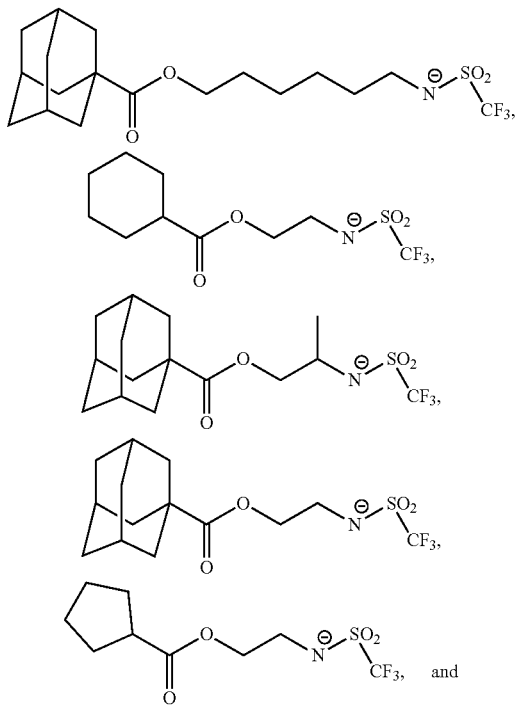

and wherein the anion component has a chemical selected from the group consisting of:

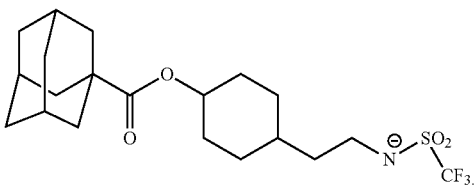

14. The method of claim 8, wherein the photoresist layer further includes a thermal acid generator, wherein the thermal acid generator has a chemical selected from the group consisting of:

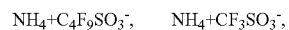

$NH_4^+C_4F_9SO_3^-$, $NH_4^+CF_3SO_3^-$,

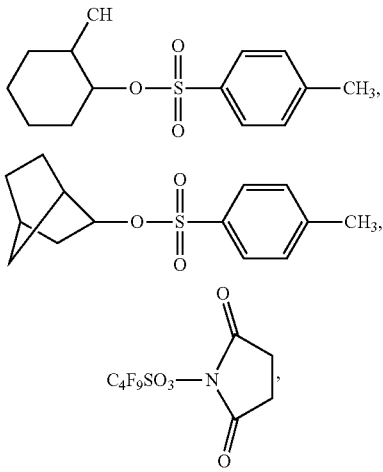

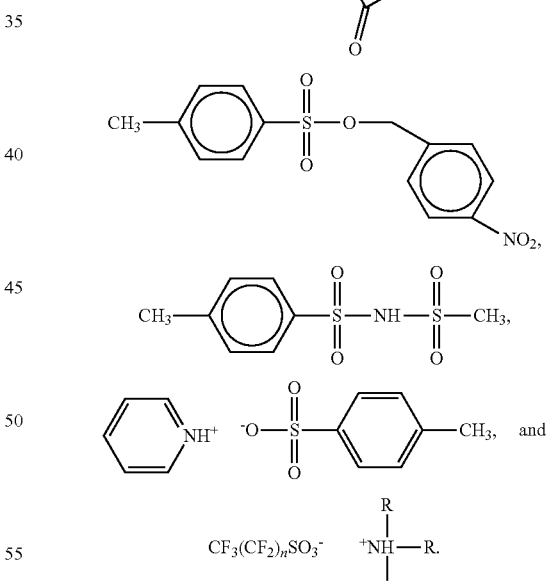

15. The method of claim 14, wherein a concentration of the thermal acid generator has a loading that is about 1%-10% weight percentage of the photoresist layer.

16. The method of claim 8, wherein the photoresist layer further includes a photo sensitivity cross-linker, wherein the photo sensitivity cross-linker has a chemical selected from the group consisting of:

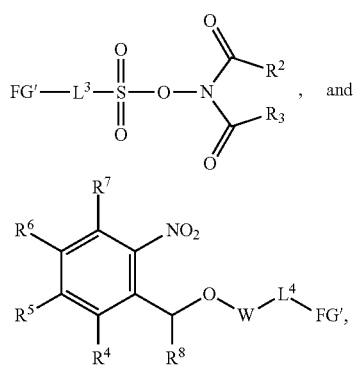

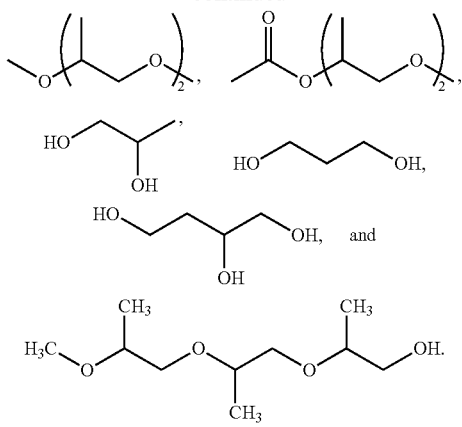

wherein:
FG' represents primary amines, secondary amines, hydroxyls, amides, esters, epoxies, episulfides, or anhydrid;
W represents a carbonyl (C=O) group or a sulfonyl (SO2) group;
$L^3$ represents a linking group covalently bonding FG' to a sulfo($SO_2$) group;
$L^4$ is a linking group covalently bonding FG' to W;
$R^2$ and $R^3$ each represents a carbon-containing moiety or in combination form a carbon-containing ring, provided that at least one of $R^2$ and $R^3$ or the carbon-containing ring is substituted with at least one FG'; and
$R^4$, $R^5$, $R^6$, $R^7$, and $R^8$ each represents: H, a halide, a substituted or unsubstituted alkyl, cycloalkyl, aryl, alkaryl, ether groups, a haloalkyl, a heteroaryl, or an alkoxyl, provided that at least one of $R^4$, $R^5$, $R^6$, $R^7$, and $R^8$ comprises primary amines, secondary amines, hydroxy amides, esters, epoxies, episulfides, or anhydrides.

17. A method, comprising:
receiving a photoresist that contains metal; and
adding, to the photoresist, a material that includes:
a solvent having a boiling point greater than about 150 degrees Celsius, a photo acid generator, a photo base generator, a quencher, a photo de-composed base, a thermal acid generator, and a photo sensitivity crosslinker, and wherein the solvent has a chemical formula selected from the group consisting of:

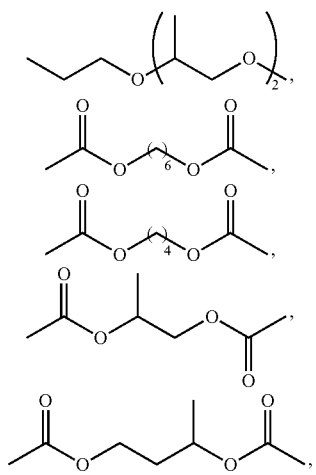

18. The method of claim 17, further comprising: performing an extreme ultraviolet (EUV) lithography process using the photoresist after the material has been added to the photoresist.

19. The method of claim 17, wherein the photoresist has a structure that includes a core group surrounded by multiple ligands, and wherein at least some of the ligands separate from the core group as a result of aging.

20. The method of claim 17, wherein the photo acid generator includes a cation component and an anion component, wherein the cation component has a chemical formula selected from the group consisting of:

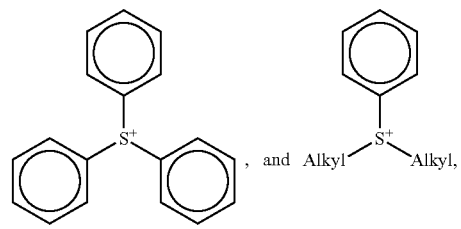

wherein the anion component has a chemical formula selected from the group consisting of:

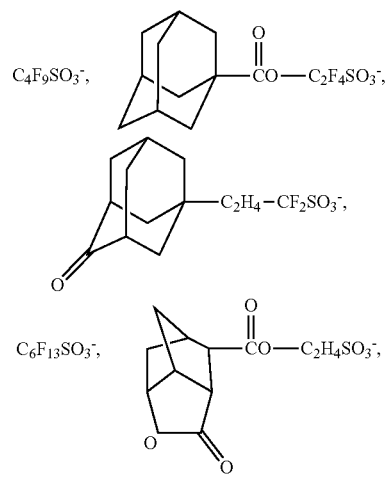

-continued
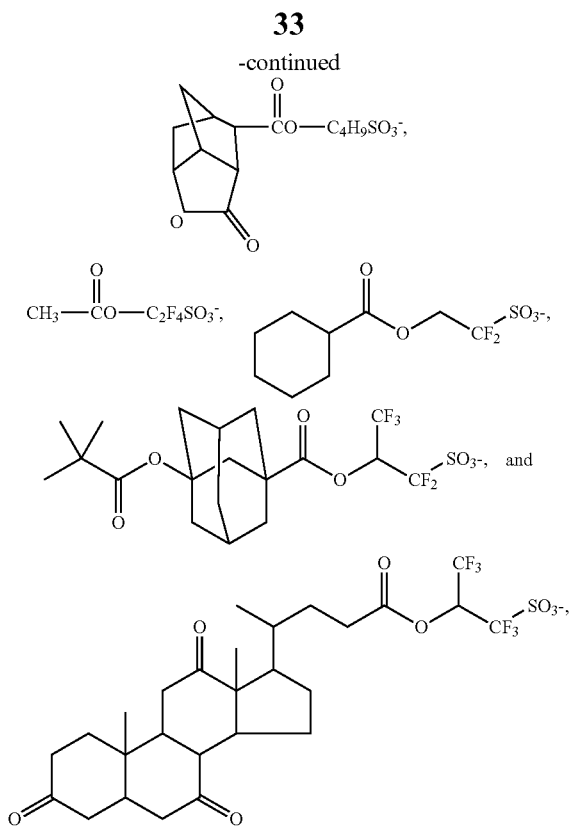
wherein the photo base generator has a chemical formula selected from the group consisting of:
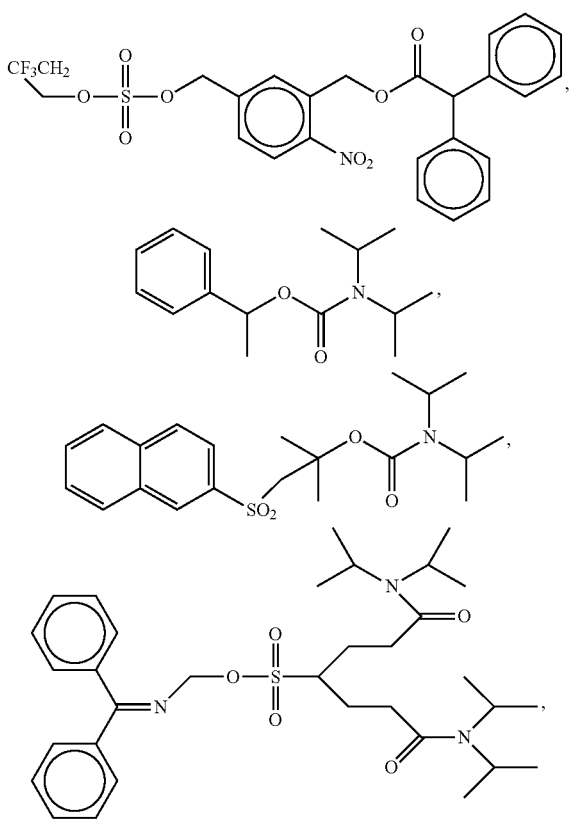
-continued
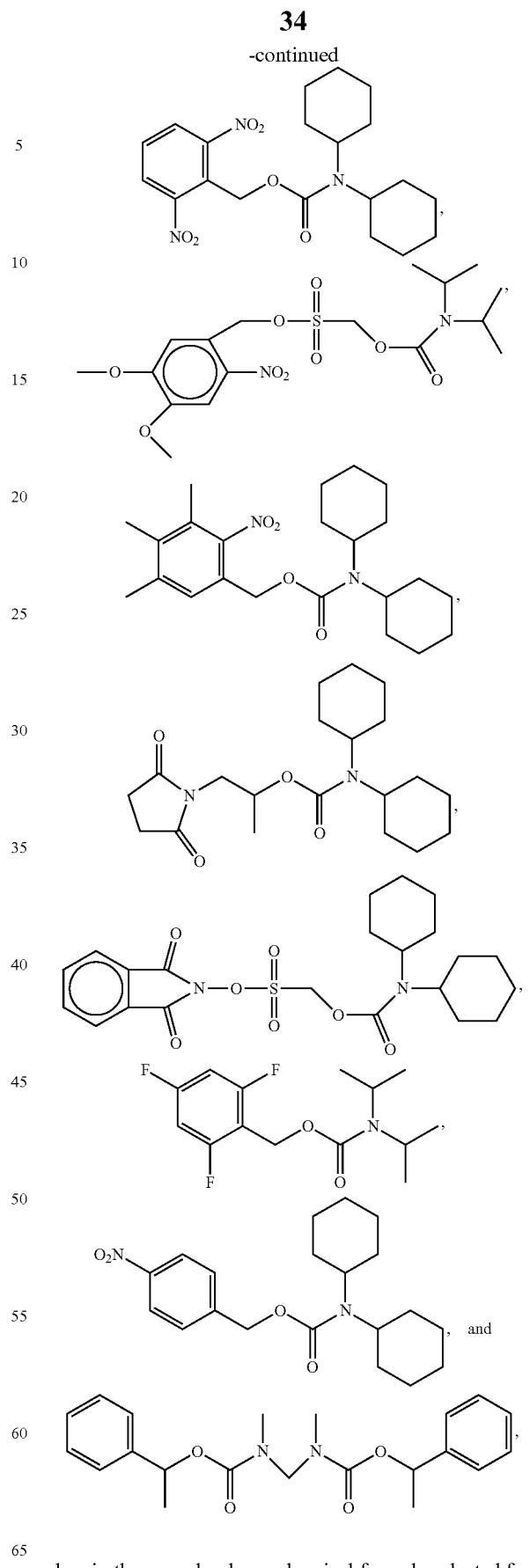
wherein the quencher has a chemical formula selected from the group consisting of:

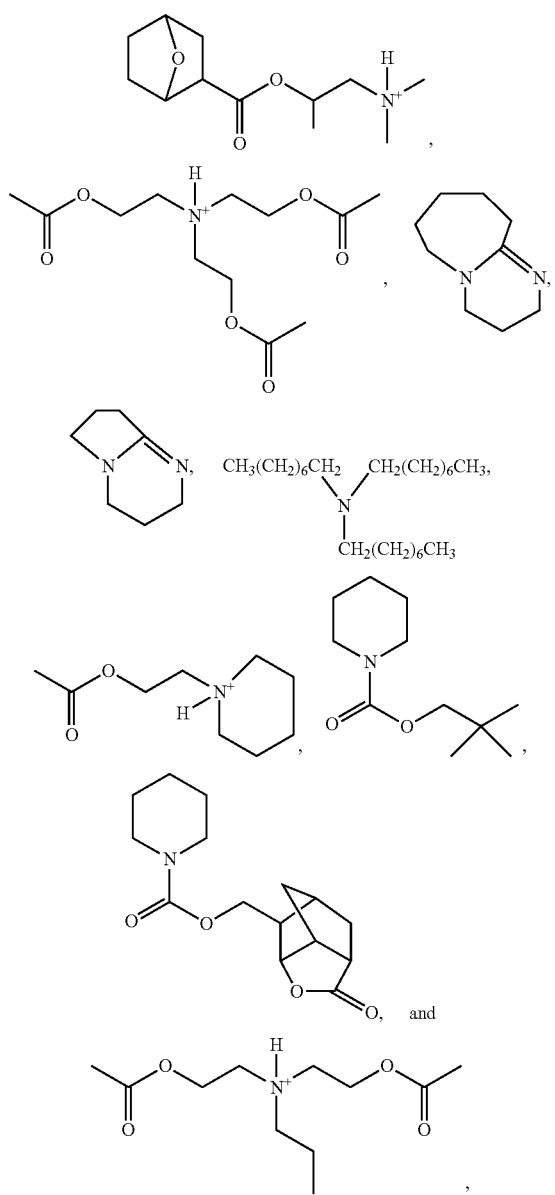

wherein the photo de-composed base includes a cation component and an anion component, wherein the cation component has a chemical formula selected from the group consisting of:

and wherein the anion component has a chemical selected from the group consisting of:

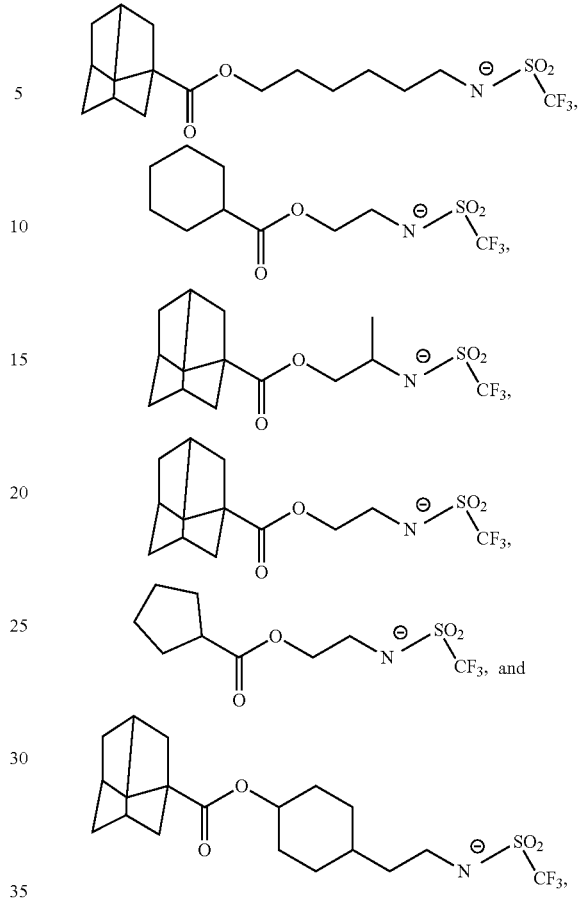

wherein the thermal acid generator has a chemical selected from the group consisting of:

NH$_4^+$C$_4$F$_9$SO$_3^-$, NH$_4^+$CF$_3$SO$_3^-$,

NH$_4^+$C$_4$F$_9$SO$_3^-$, NH$_4^+$CF$_3$SO$_3^-$,

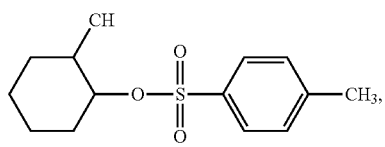

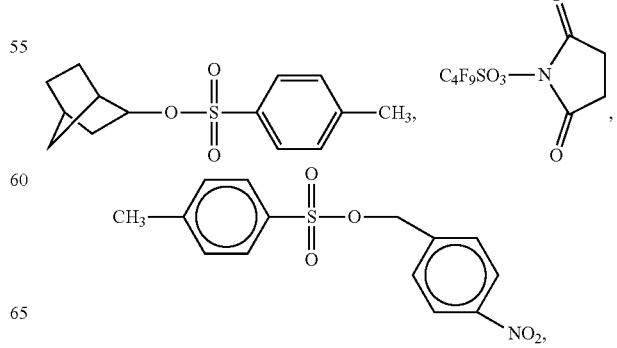

-continued

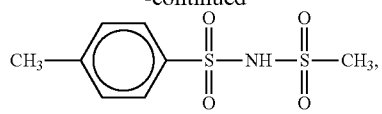

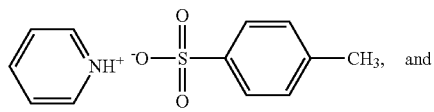

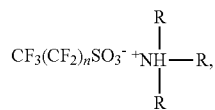

and wherein the anion component has a chemical selected from the group consisting of:

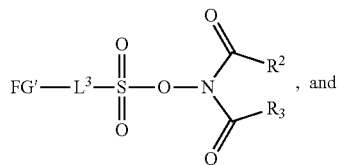, and

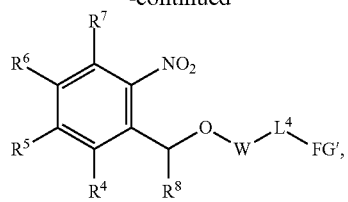

wherein:
FG' represents primary amines, secondary amines, hydroxyls, amides, esters, epoxies, episulfides, or anhydrid;
W represents a carbonyl (C=O) group or a sulfonyl (SO2) group;
$L^3$ represents a linking group covalently bonding FG' to a sulfo($SO_2$) group;
$L^4$ is a linking group covalently bonding FG' to W;
$R^2$ and $R^3$ each represents a carbon-containing moiety or in combination form a carbon-containing ring, provided that at least one of $R^2$ and $R^3$ or the carbon-containing ring is substituted with at least one FG'; and
$R^4$, $R^5$, $R^6$, $R^7$, and $R^8$ each represents: H, a halide, a substituted or unsubstituted alkyl, cycloalkyl, aryl, alkaryl, ether groups, a haloalkyl, a heteroaryl, or an alkoxyl, provided that at least one of $R^4$, $R^5$, $R^6$, $R^7$, and $R^8$ comprises primary amines, secondary amines, hydroxy amides, esters, epoxies, episulfides, or anhydrides.

* * * * *